US012126456B2

(12) United States Patent
O'Brien et al.

(10) Patent No.: US 12,126,456 B2
(45) Date of Patent: *Oct. 22, 2024

(54) MULTIPLE PHASE PULSE POWER IN A NETWORK COMMUNICATIONS SYSTEM

(71) Applicant: CISCO TECHNOLOGY, INC., San Jose, CA (US)

(72) Inventors: Richard Anthony O'Brien, Livermore, CA (US); Douglas Paul Arduini, San Ramon, CA (US); Sung Kee Baek, San Ramon, CA (US); Ruqi Li, Fremont, CA (US); Joel Richard Goergen, Soulsbyville, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 147 days.

This patent is subject to a terminal disclaimer.

(21) Appl. No.: 17/560,424

(22) Filed: Dec. 23, 2021

(65) Prior Publication Data

US 2022/0116238 A1   Apr. 14, 2022

Related U.S. Application Data

(63) Continuation of application No. 16/380,954, filed on Apr. 10, 2019, now Pat. No. 11,456,883.

(Continued)

(51) Int. Cl.
*H04L 12/10* (2006.01)
*G01R 31/08* (2020.01)

(Continued)

(52) U.S. Cl.
CPC ............ *H04L 12/10* (2013.01); *G01R 31/085* (2013.01); *H04L 41/0677* (2013.01); *G06F 1/26* (2013.01);

(Continued)

(58) Field of Classification Search
CPC . G06F 1/26; G06F 1/266; G06F 1/263; H04L 12/40045; H04L 12/10; H04L 41/0677; G01R 31/085

(Continued)

(56) References Cited

U.S. PATENT DOCUMENTS 3,335,324 A   8/1967   Buckeridge
3,962,529 A   6/1976   Kubo (Continued)

FOREIGN PATENT DOCUMENTS

CA   2202500 A1   4/1996
CN   1511369 A    7/2004

(Continued)

OTHER PUBLICATIONS

International Preliminary Report on Patentability for International Application No. PCT/US2020/012758, mailed Aug. 5, 2021, 10 Pages.

(Continued)

*Primary Examiner* — Ji H Bae

(57) ABSTRACT

In one embodiment, an apparatus comprises an input power interface for receiving input power, a power control system for transmitting DC (Direct Current) pulse power on multiple phases over a cable to a plurality of powered devices and verifying cable operation during an off-time of pulses in the DC pulse power, and a cable interface for delivery of the DC pulse power on the multiple phases and data over the cable to the powered devices. A method for transmitting multiple phase pulse power is also disclosed herein.

28 Claims, 15 Drawing Sheets

Related U.S. Application Data

(60) Provisional application No. 62/817,813, filed on Mar. 13, 2019.

(51) Int. Cl.
   *G06F 1/26* (2006.01)
   *H04L 12/40* (2006.01)
   *H04L 41/0677* (2022.01)

(52) U.S. Cl.
   CPC .............. *G06F 1/263* (2013.01); *G06F 1/266* (2013.01); *H04L 12/40045* (2013.01)

(58) Field of Classification Search
   USPC .......................................... 713/300; 700/286
   See application file for complete search history.

(56) References Cited

U.S. PATENT DOCUMENTS

| | | | |
|---|---|---|---|
| 4,020,396 A | 4/1977 | Gambale et al. | |
| 4,283,678 A * | 8/1981 | Halter .................... | G01R 15/18 |
| | | | 327/342 |
| 4,811,187 A | 3/1989 | Nakajima | |
| 4,997,388 A | 3/1991 | Dale | |
| 5,159,684 A | 10/1992 | Kroll et al. | |
| 5,652,893 A | 7/1997 | Ben-Meir et al. | |
| 6,008,631 A | 12/1999 | Johari | |
| 6,220,955 B1 | 4/2001 | Posa | |
| 6,259,745 B1 | 7/2001 | Chan | |
| 6,295,356 B1 | 9/2001 | De Nicolo | |
| 6,448,672 B1 | 9/2002 | Voegeli et al. | |
| 6,636,538 B1 | 10/2003 | Stephens | |
| 6,685,364 B1 | 2/2004 | Brezina | |
| 6,756,881 B2 | 6/2004 | Bateman et al. | |
| 6,784,790 B1 | 8/2004 | Lester | |
| 6,826,368 B1 | 11/2004 | Koren | |
| 6,855,881 B2 | 2/2005 | Khoshnood | |
| 6,860,004 B2 | 3/2005 | Hirano et al. | |
| 7,325,150 B2 | 1/2008 | Lehr | |
| 7,417,443 B2 | 8/2008 | Admon et al. | |
| 7,420,355 B2 | 9/2008 | Liu | |
| 7,490,996 B2 | 2/2009 | Sommer | |
| 7,492,059 B2 | 2/2009 | Peker et al. | |
| 7,509,505 B2 | 3/2009 | Randall et al. | |
| 7,564,904 B2 | 7/2009 | Isachar et al. | |
| 7,566,987 B2 | 7/2009 | Black et al. | |
| 7,583,703 B2 | 9/2009 | Bowser | |
| 7,589,435 B2 | 9/2009 | Metsker | |
| 7,593,747 B1 | 9/2009 | Karam | |
| 7,603,570 B2 | 10/2009 | Schindler et al. | |
| 7,616,465 B1 | 11/2009 | Vinciarelli | |
| 7,813,646 B2 | 10/2010 | Furey | |
| 7,835,389 B2 | 11/2010 | Yu | |
| 7,854,634 B2 | 12/2010 | Filipon et al. | |
| 7,881,072 B2 | 2/2011 | Dibene et al. | |
| 7,915,761 B1 | 3/2011 | Jones | |
| 7,921,307 B2 | 4/2011 | Karam | |
| 7,924,579 B2 | 4/2011 | Arduini | |
| 7,940,787 B2 | 5/2011 | Karam | |
| 7,973,538 B2 | 7/2011 | Karam | |
| 8,020,043 B2 | 9/2011 | Karam | |
| 8,037,324 B2 | 10/2011 | Hussain | |
| 8,068,937 B2 | 11/2011 | Eaves | |
| 8,081,589 B1 | 12/2011 | Gilbrech et al. | |
| 8,184,525 B2 | 5/2012 | Karam | |
| 8,276,397 B1 | 10/2012 | Carlson | |
| 8,279,883 B2 | 10/2012 | Diab et al. | |
| 8,310,089 B2 | 11/2012 | Schindler | |
| 8,319,627 B2 | 11/2012 | Chan et al. | |
| 8,345,439 B1 | 1/2013 | Goergen | |
| 8,350,538 B2 | 1/2013 | Cuk | |
| 8,358,893 B1 | 1/2013 | Sanderson | |
| 8,386,820 B2 | 2/2013 | Diab | |
| 8,638,008 B2 | 1/2014 | Baldwin et al. | |
| 8,700,923 B2 | 4/2014 | Fung | |
| 8,712,324 B2 | 4/2014 | Corbridge et al. | |
| 8,750,710 B1 | 6/2014 | Hirt et al. | |
| 8,768,528 B2 | 7/2014 | Millar et al. | |
| 8,781,637 B2 | 7/2014 | Eaves | |
| 8,787,775 B2 | 7/2014 | Earnshaw | |
| 8,793,511 B1 | 7/2014 | Bishara | |
| 8,829,917 B1 | 9/2014 | Lo | |
| 8,836,228 B2 | 9/2014 | Xu | |
| 8,842,430 B2 | 9/2014 | Hellriegel | |
| 8,849,471 B2 | 9/2014 | Daniel et al. | |
| 8,898,446 B2 | 11/2014 | Ronen et al. | |
| 8,966,747 B2 | 3/2015 | Vinciarelli et al. | |
| 8,971,399 B2 | 3/2015 | Kwon et al. | |
| 9,001,881 B2 | 4/2015 | Okamura et al. | |
| 9,024,473 B2 | 5/2015 | Huff | |
| 9,184,795 B2 | 11/2015 | Eaves | |
| 9,189,043 B2 | 11/2015 | Vorenkamp | |
| 9,273,906 B2 | 3/2016 | Goth | |
| 9,319,101 B2 | 4/2016 | Lontka | |
| 9,321,362 B2 | 4/2016 | Woo et al. | |
| 9,373,963 B2 | 6/2016 | Kuznetsov | |
| 9,419,436 B2 | 8/2016 | Eaves et al. | |
| 9,484,771 B2 | 11/2016 | Braylovskiy | |
| 9,510,479 B2 | 11/2016 | Vos | |
| 9,531,551 B2 | 12/2016 | Balasubramanian | |
| 9,590,811 B2 | 3/2017 | Hunter, Jr. | |
| 9,618,714 B2 | 4/2017 | Murray | |
| 9,640,998 B2 | 5/2017 | Dawson | |
| 9,665,148 B2 | 5/2017 | Hamdi | |
| 9,693,244 B2 | 6/2017 | Maruhashi | |
| 9,734,940 B1 | 8/2017 | McNutt | |
| 9,768,978 B2 | 9/2017 | Coenen et al. | |
| 9,853,689 B2 | 12/2017 | Eaves | |
| 9,874,930 B2 | 1/2018 | Vavilala | |
| 9,882,656 B2 | 1/2018 | Sipes, Jr. et al. | |
| 9,891,678 B2 | 2/2018 | Butcher et al. | |
| 9,893,521 B2 | 2/2018 | Eaves | |
| 9,948,198 B2 | 4/2018 | Imai | |
| 9,979,370 B2 | 5/2018 | Xu | |
| 9,985,600 B2 | 5/2018 | Xu et al. | |
| 10,007,628 B2 | 6/2018 | Pitigoi-Aron | |
| 10,028,417 B2 | 7/2018 | Schmidtke | |
| 10,128,764 B1 | 11/2018 | Vinciarelli | |
| 10,248,178 B2 | 4/2019 | Brooks et al. | |
| 10,263,526 B2 | 4/2019 | Sandusky et al. | |
| 10,281,513 B1 | 5/2019 | Goergen | |
| 10,374,813 B2 | 8/2019 | Sheffield | |
| 10,407,995 B2 | 9/2019 | Moeny | |
| 10,439,432 B2 | 10/2019 | Eckhardt et al. | |
| 10,468,879 B2 | 11/2019 | Eaves | |
| 10,541,543 B2 | 1/2020 | Eaves | |
| 10,541,758 B2 | 1/2020 | Goergen | |
| 10,631,443 B2 | 4/2020 | Byers | |
| 10,671,146 B2 | 6/2020 | Wendt et al. | |
| 10,714,930 B1 | 7/2020 | Weiss et al. | |
| 10,735,105 B2 | 8/2020 | Goergen et al. | |
| 2001/0024373 A1 | 9/2001 | Cuk | |
| 2002/0126967 A1 | 9/2002 | Panak | |
| 2004/0000816 A1 | 1/2004 | Khoshnood | |
| 2004/0033076 A1 | 2/2004 | Song | |
| 2004/0043651 A1 | 3/2004 | Bain | |
| 2004/0073703 A1 | 4/2004 | Boucher | |
| 2004/0264214 A1 | 12/2004 | Xu | |
| 2005/0086546 A1 | 4/2005 | Darshan et al. | |
| 2005/0197018 A1 | 9/2005 | Lord | |
| 2005/0268120 A1 | 12/2005 | Schindler | |
| 2006/0164099 A1 | 7/2006 | Steennis et al. | |
| 2006/0202109 A1 | 9/2006 | Delcher | |
| 2006/0209875 A1 | 9/2006 | Lum et al. | |
| 2006/0268898 A1 | 11/2006 | Karam | |
| 2007/0091648 A1 | 4/2007 | Johnston | |
| 2007/0103168 A1 | 5/2007 | Batten | |
| 2007/0143508 A1 | 6/2007 | Linnman | |
| 2007/0236853 A1 | 10/2007 | Crawley | |
| 2007/0263675 A1 | 11/2007 | Lum et al. | |
| 2007/0284941 A1 | 12/2007 | Robbins | |
| 2007/0284946 A1 | 12/2007 | Robbins | |
| 2007/0288125 A1 | 12/2007 | Quaratiello | |
| 2007/0288771 A1 | 12/2007 | Robbins | |

(56) References Cited

U.S. PATENT DOCUMENTS

| | | |
|---|---|---|
| 2008/0054720 A1 | 3/2008 | Lum |
| 2008/0166715 A1 | 7/2008 | Hillis et al. |
| 2008/0198635 A1 | 8/2008 | Hussain |
| 2008/0229120 A1 | 9/2008 | Diab |
| 2008/0310067 A1 | 12/2008 | Diab |
| 2009/0027033 A1 | 1/2009 | Diab |
| 2010/0077239 A1 | 3/2010 | Diab |
| 2010/0117808 A1 | 5/2010 | Karam |
| 2010/0171602 A1 | 7/2010 | Kabbara |
| 2010/0190384 A1 | 7/2010 | Lanni |
| 2010/0214082 A1 | 8/2010 | Covaro et al. |
| 2010/0237846 A1 | 9/2010 | Vetteth |
| 2010/0290190 A1 | 11/2010 | Chester |
| 2010/0327793 A1 | 12/2010 | Komulainen et al. |
| 2011/0007664 A1 | 1/2011 | Diab |
| 2011/0290497 A1 | 1/2011 | Stenevik |
| 2011/0057612 A1 | 3/2011 | Taguchi |
| 2011/0083824 A1 | 4/2011 | Rogers |
| 2011/0228578 A1 | 9/2011 | Serpa et al. |
| 2011/0266867 A1 | 11/2011 | Schindler |
| 2012/0043935 A1 | 2/2012 | Dyer |
| 2012/0064745 A1 | 3/2012 | Ottliczky |
| 2012/0170927 A1 | 7/2012 | Huang |
| 2012/0201089 A1 | 8/2012 | Barth |
| 2012/0231654 A1 | 9/2012 | Conrad |
| 2012/0287984 A1 | 11/2012 | Lee |
| 2012/0317426 A1 | 12/2012 | Hunter, Jr. |
| 2012/0319468 A1 | 12/2012 | Schneider |
| 2013/0077923 A1 | 3/2013 | Peeters Weem |
| 2013/0079633 A1 | 3/2013 | Weem |
| 2013/0103220 A1 | 4/2013 | Eaves |
| 2013/0249292 A1 | 9/2013 | Blackwell, Jr. |
| 2013/0272721 A1 | 10/2013 | Van Veen |
| 2013/0329344 A1 | 12/2013 | Tucker |
| 2014/0111180 A1 | 4/2014 | Vladan et al. |
| 2014/0126151 A1 | 5/2014 | Campbell |
| 2014/0129850 A1 | 5/2014 | Paul |
| 2014/0258742 A1 | 9/2014 | Chien |
| 2014/0258813 A1 | 9/2014 | Lusted |
| 2014/0265550 A1 | 9/2014 | Milligan et al. |
| 2014/0268958 A1 | 9/2014 | Chapman |
| 2014/0372773 A1 | 12/2014 | Heath et al. |
| 2015/0078740 A1 | 3/2015 | Sipes, Jr. |
| 2015/0106539 A1 | 4/2015 | Leinonen |
| 2015/0115741 A1 | 4/2015 | Dawson |
| 2015/0207317 A1 | 7/2015 | Radermacher |
| 2015/0215001 A1 | 7/2015 | Eaves |
| 2015/0215131 A1 | 7/2015 | Paul et al. |
| 2015/0333918 A1 | 11/2015 | White, III |
| 2015/0365003 A1 | 12/2015 | Sadwick |
| 2016/0018252 A1 | 1/2016 | Hanson |
| 2016/0020911 A1 | 1/2016 | Sipes, Jr. |
| 2016/0064938 A1 | 3/2016 | Balasubramanian |
| 2016/0111877 A1 | 4/2016 | Eaves |
| 2016/0118784 A1 | 4/2016 | Saxena et al. |
| 2016/0133355 A1 | 5/2016 | Glew et al. |
| 2016/0134331 A1 | 5/2016 | Eaves |
| 2016/0142217 A1 | 5/2016 | Gardner |
| 2016/0188427 A1 | 6/2016 | Chandrashekar |
| 2016/0197600 A1 | 7/2016 | Kuznetsov |
| 2016/0365967 A1 | 7/2016 | Tu |
| 2016/0241148 A1 | 8/2016 | Kizilyalli |
| 2016/0262288 A1 | 9/2016 | Chainer |
| 2016/0273722 A1 | 9/2016 | Crenshaw |
| 2016/0294500 A1 | 10/2016 | Chawgo et al. |
| 2016/0294568 A1 | 10/2016 | Chawgo et al. |
| 2016/0308683 A1 | 10/2016 | Pischl |
| 2016/0352535 A1 | 12/2016 | Hiscock |
| 2017/0041152 A1 | 2/2017 | Sheffield |
| 2017/0041153 A1 | 2/2017 | Picard et al. |
| 2017/0054296 A1 | 2/2017 | Daniel |
| 2017/0110871 A1 | 4/2017 | Foster |
| 2017/0123466 A1 | 5/2017 | Carnevale |
| 2017/0146260 A1 | 5/2017 | Ribbich |
| 2017/0155517 A1 | 6/2017 | Cao |
| 2017/0164525 A1 | 6/2017 | Chapel |
| 2017/0155518 A1 | 7/2017 | Yang |
| 2017/0214236 A1 | 7/2017 | Eaves |
| 2017/0229886 A1 | 8/2017 | Eaves |
| 2017/0234738 A1 | 8/2017 | Ross |
| 2017/0248976 A1 | 8/2017 | Moller |
| 2017/0294966 A1 | 10/2017 | Jia |
| 2017/0325320 A1 | 11/2017 | Wendt |
| 2018/0024964 A1 | 1/2018 | Mao |
| 2018/0045768 A1 | 2/2018 | Godfrey et al. |
| 2018/0053313 A1 | 2/2018 | Smith |
| 2018/0054083 A1 | 2/2018 | Hick |
| 2018/0060269 A1 | 3/2018 | Kessler |
| 2018/0088648 A1 | 3/2018 | Otani |
| 2018/0098201 A1 | 4/2018 | Torello et al. |
| 2018/0102604 A1 | 4/2018 | Keith |
| 2018/0123360 A1 | 5/2018 | Eaves |
| 2018/0180658 A1* | 6/2018 | Godfrey .............. G01L 1/242 |
| 2018/0188712 A1 | 7/2018 | MacKay |
| 2018/0191513 A1 | 7/2018 | Hess |
| 2018/0254624 A1 | 9/2018 | Son |
| 2018/0313886 A1 | 11/2018 | Mlyniec et al. |
| 2018/0340840 A1 | 11/2018 | Bullock |
| 2019/0064890 A1 | 2/2019 | Donachy et al. |
| 2019/0126764 A1 | 5/2019 | Fuhrer |
| 2019/0170804 A1* | 6/2019 | Thomas .............. G01R 31/69 |
| 2019/0267804 A1 | 8/2019 | Matan et al. |
| 2019/0272011 A1 | 9/2019 | Goergen |
| 2019/0277899 A1 | 9/2019 | Goergen |
| 2019/0277900 A1 | 9/2019 | Goergen |
| 2019/0278347 A1 | 9/2019 | Goergen |
| 2019/0280895 A1 | 9/2019 | Mather et al. |
| 2019/0304630 A1 | 10/2019 | Goergen |
| 2019/0312751 A1 | 10/2019 | Goergen |
| 2019/0342011 A1 | 10/2019 | Goergen |
| 2019/0363493 A1 | 11/2019 | Sironi |
| 2020/0044751 A1 | 2/2020 | Goergen |
| 2020/0228001 A1 | 7/2020 | Lambert et al. |
| 2020/0295955 A1 | 9/2020 | O'Brien et al. |
| 2022/0190587 A1 | 6/2022 | Eaves et al. |

FOREIGN PATENT DOCUMENTS

| | | |
|---|---|---|
| CN | 1209880 C | 7/2005 |
| CN | 201689347 U | 12/2010 |
| CN | 103888272 A | 6/2014 |
| CN | 203859673 U | 10/2014 |
| CN | 105024583 A | 11/2015 |
| CN | 204836199 U | 12/2015 |
| CN | 205544597 | 8/2016 |
| CN | 104081237 B | 10/2016 |
| CN | 106165342 A | 11/2016 |
| CN | 104412541 B | 5/2019 |
| EP | 1936861 A1 | 6/2008 |
| EP | 2120443 A1 | 11/2009 |
| EP | 2257009 A2 | 1/2010 |
| EP | 2432134 A1 | 3/2012 |
| EP | 2693688 A1 | 2/2014 |
| EP | 3096435 A1 | 11/2016 |
| GB | 2539894 A | 1/2017 |
| JP | 2012016206 A | 1/2012 |
| WO | WO199316407 A1 | 8/1993 |
| WO | WO2006127916 A2 | 11/2006 |
| WO | WO2010053542 | 5/2010 |
| WO | WO2017054030 | 4/2017 |
| WO | WO2017167926 A1 | 10/2017 |
| WO | 2018017544 A1 | 1/2018 |
| WO | WO2019023731 A1 | 2/2019 |
| WO | WO2019212759 A1 | 11/2019 |
| WO | 2020154101 A1 | 7/2020 |
| WO | 2020154103 A1 | 7/2020 |

OTHER PUBLICATIONS

International Preliminary Report on Patentability for International Application No. PCT/US2020/012801, mailed Aug. 5, 2021, 9 Pages.

(56) References Cited

OTHER PUBLICATIONS

International Preliminary Report on Patentability for International Application No. PCT/US2020/020359, mailed Sep. 23, 2021, 9 Pages.
International Search Report and Written Opinion for International Application No. PCT/US2020/012758, mailed Apr. 8, 2020, 11 Pages.
International Search Report and Written Opinion for International Application No. PCT/US2020/012801, mailed Apr. 15, 2020, 10 Pages.
International Search Report and Written Opinion for International Application No. PCT/US2020/020359, mailed May 27, 2020, 10 Pages.
English Translation of Office Action in counterpart Chinese Application No. 202080018474.2, mailed Oct. 19, 2022, 20 pages.
*Voltserver Inc.*, v. *Cisco Technology, Inc.*, "Decision Denying Institution of Post-Grant Review," United States Patent and Trademark Office, PGR2021-00055, U.S. Pat. No. 10,735,105 B2, Aug. 19, 2021, 25 pages.
*Voltserver Inc.*, v. *Cisco Technology, Inc.*, "Patent Owner's Preliminary Response to Post Grant Review Under 35 U.S.C. § 312 and 37 C.F.R. § 42.107," United States Patent and Trademark Office, PGR2021-00055, U.S. Pat. No. 10,735,105, 2021, Jun. 2, 2021, 51 pages.
"Effects of current on human beings and livestok—Part 1: General aspects," Technical Specification, Basic Safety Publication, IEC/TS 60479-1, Edition 4.0, Jul. 2005, 122 pages.
"Information technology equipment—Safety—Part 1: General requirements," International Standard, IEC 60950-1, Edition 2.2, May 2013, pp. 1-61, 63 pages.
"Information technology equipment—Safety—Part 1: General requirements," International Standard, IEC 60950-1, Edition 2.2, May 2013, pp. 62-122, 61 pages.
"Information technology equipment—Safety—Part 1: General requirements," International Standard, IEC 60950-1, Edition 2.2, May 2013, pp. 123-181, 59 pages.
"Information technology equipment—Safety—Part 1: General requirements," International Standard, IEC 60950-1, Edition 2.2, May 2013, pp. 182-253, 72 pages.
"Information technology equipment—Safety—Part 1: General requirements," International Standard, IEC 60950-1, Edition 2.2, May 2013, pp. 254-319, 66 pages.
"Information technology equipment—Safety—Part 1: General requirements," International Standard, IEC 60950-1, Edition 2.2, May 2013, pp. 320-377, 58 pages.
"Information technology equipment—Safety—Part 1: General requirements," International Standard, IEC 60950-1, Edition 2.2, May 2013, pp. 378-433, 56 pages.
"Information technology equipment—Safety—Part 1: General requirements," International Standard, IEC 60950-1, Edition 2.2, May 2013, pp. 434-490, 57 pages.
"Information technology equipment—Safety—Part 1: General requirements," International Standard, IEC 60950-1, Edition 2.2, May 2013, pp. 491-551, 61 pages.
"Information technology equipment—Safety—Part 1: General requirements," International Standard, IEC 60950-1, Edition 2.2, May 2013, pp. 552-622, 71 pages.
"Information technology equipment—Safety—Part 1: General requirements," International Standard, IEC 60950-1, Edition 2.2, May 2013, pp. 623-644, 24 pages.
"Low-voltage switchgear and controlgear—Part 1: General rules," International Standard, Amendment 2, IEC 60947-1, Edition 5.0, Sep. 2014, pp. 1-63, 65 pages.
"Low-voltage switchgear and controlgear—Part 1: General rules," International Standard, Amendment 2, IEC 60947-1, Edition 5.0, Sep. 2014, pp. 64-102, 41 pages.
Stephen Edelstein, "Updated 2016 Tesla Model S also gets new 75-kWhbattery option," Internet Archive WayBack Machine, Green Car Reports, May 5, 2016, 3 pages.
Stephen S. Eaves, "Network Remote Powering using Packet Energy Transfer," IEEE Xplore, Proceedings of IEEE International Conference on Telecommunications Energy (INTELEC) 2012, 978-1-4673-1000, Sep. 30-Oct. 4, 2012, 4 pages.
"Audio/video, information and communication technology equipment—Part 1: Safety requirements," International Standard, IEC 62368-1, Edition 2.0, Feb. 2014, pp. 1-132, 134 pages.
"Audio/video, information and communication technology equipment—Part 1: Safety requirements," International Standard, IEC 62368-1, Edition 2.0, Feb. 2014, pp. 133-263, 131 pages.
"Audio/video, information and communication technology equipment—Part 1: Safety requirements," International Standard, IEC 62368-1, Edition 2.0, Feb. 2014, pp. 264-387, 124 pages.
"Audio/video, information and communication technology equipment—Part 1: Safety requirements," International Standard, IEC 62368-1, Edition 2.0, Feb. 2014, pp. 388-508, 121 pages.
"Audio/video, information and communication technology equipment—Part 1: Safety requirements," International Standard, IEC 62368-1, Edition 2.0, Feb. 2014, pp. 509-593, 85 pages.
"Audio/video, information and communication technology equipment—Part 1: Safety requirements," International Standard, IEC 62368-1, Edition 2.0, Feb. 2014, pp. 594-676, 85 pages.
"National Electrical Code," National Fire Protection Association (NFPA) 70, 2017, 881 pages.
*Voltserver Inc.*, v. *Cisco Technology, Inc.*, "Declaration of David A. Durfee, Ph.D.," United States Patent and Trademark Office, PGR2021-00055, U.S. Pat. No. 10,735,105, Feb. 16, 2021, 340 pages.
David A. Durfee Ph.D., "Curriculum Vitae," 4 pages.
Adel S. Sedra, "Microelectronic Circuits," Sedra/Smith, Oxford University Press, Seventh Edition, 2015, 38 pages.
Charles k. Alexander, et al., "Fundamentals of Electric Circuits," McGraw Hill Education, Indian Edition 5e, 2013, 37 pages.
Andrew S. Tanenbaum, "Computer Networks," Prentice Hall PTR, Third Edition, 1996, 12 pages.
William Stallings, "Data and Computer Communications," Macmillan Publishing Company, Fourth Edition, 1994, 14 pages.
B.P. Lathi, et al., "Modern Digital and Analog Communication Systems," Oxford University Press, Fourth Edition, 2009, 15 pages.
*Voltserver Inc.*, v. *Cisco Technology, Inc.*, "Petition for Post Grant Review of U.S. Pat. No. 10,735,105," United States Patent and Trademark Office, PGR2021-00055, U.S. Pat. No. 10,735,105, Feb. 16, 2021, 132 pages.
Stephen H. Hall, et al., "High-Speed Digital System Design: A handbook of Interconnect Theory and Design Practices,", John Wiley & Sons, Inc., 2000, 55 pages.
"Understanding 802.3at, PoE Plus Standard Increases Available Power," Microsemi, Jun. 2011, 7 pages.
"Digital Electricity Gen2 Detailed Installation Manual," Voltserver Digital Electricity, Rev B.1, Nov. 29, 2017, 68 pages.
Berkeley Lab ETA, "Touch-Safe, High Voltage Digital Electricity Transmission using Packet Energy Transfer," Vimeo, https://vimeo.com/172469008, Mar. 8, 2016, 8 pages.
*Voltserver Inc.*, v. *Cisco Technology, Inc.*, "Decision Denying Institution of Post-Grant Review," United States Patent and Trademark Office, PGR2021-00056, U.S. Pat. No. 10,735,105 B2, Aug. 23, 2021, 18 pages.
*Voltserver Inc.*, v. *Cisco Technology, Inc.*, "Patent Owner's Preliminary Response to Post Grant Review Under 35 U.S.C. § 312 and 37 C.F.R. § 42.107," United States Patent and Trademark Office, PGR2021-00056, U.S. Pat. No. 10,735,105, 2021, Jun. 2, 2021, 46 pages.
*Voltserver Inc.*, v. *Cisco Technology, Inc.*, "Declaration of Stephens S. Eaves," United States Patent and Trademark Office, PGR2021-00056, U.S. Pat. No. 10,735,105, Feb. 16, 2021, 7 pages.
"Electrical—Computer Conference Proceedings," Internet Archive WayBack Machine Search for Intelec 2012, Curran Associates, Inc., http://www.proceedings.com/electrical-computer-proceedings.html, 2012, 125 pages.
"Part VII: A Summary of Commonly Used MARC 21 Fields," MARC, Understanding MARC, https://www.loc.gov/marc//umb/um07to10.html, retrieved from Internet Feb. 13, 2021, 17 pages.
LC Catalog-Browse, https://catalog.loc.gov/vwebv/searchBrowse, retrieved from the Internet Feb. 12, 2021, 1 page.

(56) References Cited

OTHER PUBLICATIONS

"International Telecommunications Energy Conference: [proceedings] (Marc Tags)," Library Catalog, https://catalog.loc.gov/vwebv/staffView?searchId=3877&recPointer=0&recCount=25&searchType=1&bibId=11348322, retrieved from the Internet Feb. 12, 2021, 3 pages.
*Voltserver Inc.*, v. *Cisco Technology, Inc.*, "Petition for Post Grant Review of U.S. Pat. No. 10,735,105," United States Patent and Trademark Office, PGR2021-00056, U.S. Pat. No. 10,735,105, Feb. 16, 2021, 116 pages.
"International Telecommunications Energy Conference: [proceedings] (Full Record)," Library Catalog, https://catalog.loc.gov/vwebv/holdingsInfo?searchId=3810&recPointer=0&recCount=25&searchType=1&bibId=11348322, retrieved from the Internet Feb. 12, 2021, 4 pages.
https://www.fischerconnectors.com/us/en/products/fiberoptic.
http://www.strantech.com/products/tfoca-genx-hybrid-2x2-fiber-optic-copper-connector/.
http://www.qpcfiber.com/product/connectors/e-link-hybrid-connector/.
https://www.lumentum.com/sites/default/files/technical-library-items/poweroverfiber-tn-pv-ae_0.pdf.
"Network Remote Power Using Packet Energy Transfer", Eaves et al., www.voltserver.com, Sep. 2012.
Product Overview, "Pluribus VirtualWire Solution", Pluribus Networks, PN-PO-VWS-05818, https://www.pluribusnetworks.com/assets/Pluribus-VirtualWire-PO-50918.pdf, May 2018, 5 pages.
Implementation Guide, "Virtual Chassis Technology Best Practices", Juniper Networks, 8010018-009-EN, Jan. 2016, https://wwwjuniper.net/us/en/local/pdf/implementation-guides/8010018-en.pdf, 29 pages.
Yencheck, Thermal Modeling of Portable Power Cables, 1993.
Zhang, Machine Learning-Based Temperature Prediction for Runtime Thermal Management across System Components, Mar. 2016.
Data Center Power Equipment Thermal Guidelines and Best Practices.
Dynamic Thermal Rating of Substation Terminal Equipment by Rambabu Adapa, 2004.
Chen, Real-Time Termperature Estimation for Power MOSEFETs Conidering Thermal Aging Effects:, IEEE Trnasactions on Device and Materials Reliability, vol. 14, No. 1, Mar. 2014.
Petition for Post Grant Review of U.S. Pat. No. 10,735,105 [Public], filed Feb. 16, 2021, PGR 2021-00055.
Petition for Post Grant Review of U.S. Pat. No. 10,735,105 [Public], filed Feb. 16, 2021, PGR 2021-00056.
Eaves, S. S., Network Remote Powering Using Packet Energy Transfer, Proceedings of IEEE International Conference on Telecommunications Energy (INTELEC) 2012, Scottsdale, AZ, Sep. 30-Oct. 4, 2012 (IEEE 2012) (EavesIEEE).
Edelstein S., Updated 2016 Tesla Model S also gets new 75-kWh battery option, (Jun. 19, 2016), archived Jun. 19, 2016 by Internet Archive Wayback machine at https://web.archive.org/web/20160619001148/https://www.greencarreports.com/news/1103 782_updated-2016-tesla-model-s-also-gets-new-7 5-kwh-battery-option ("Edelstein").
NFPA 70 National Electrical Code, 2017 Edition (NEC).
International Standard IEC 62368-1 Edition 2.0 (2014), ISBN 978-2-8322-1405-3 ("IEC-62368").
International Standard IEC/TS 60479-1 Edition 4.0 (2005), ISBN 2-8318-8096-3 ("IEC-60479").
International Standard IEC 60950-1 Edition 2.2 (2013), ISBN 978-2-8322-0820-5 ("IEC-60950").
International Standard IEC 60947-1 Edition 5.0 (2014), ISBN 978-2-8322-1798-6 ("IEC-60947").
Tanenbaum, A. S., Computer Networks, Third Edition (1996) ("Tanenbaum").
Stallings, W., Data and Computer Communications, Fourth Edition ( 1994) ("Stallings").
Alexander, C. K., Fundamentals of Electric Circuits, Indian Edition (2013) ("Alexander").
Hall, S. H., High-Speed Digital System Design, A Handbook of Interconnect Theory and Design Practices (2000) ("Hall").
Sedra, A. S., Microelectronic Circuits, Seventh Edition (2014) ("Sedra").
Lathi, B. P., Modem Digital and Analog Communication Systems, Fourth Edition (2009) ("Lathi").
Understanding 802.3at PoE Plus Standard Increases Available Power (Jun. 2011) ("Microsemi").
Jingquan Chen et al: "Buck-boost PWM converters having two independently controlled switches", 32nd Annual IEEE Power Electronics Specialists Conference. PESC 2001. Conference Proceedings, Vancouver, Canada, Jun. 17-21, 2001; [Annual Power Electronics Specialists Conference], New York, NY: IEEE, US, vol. 2,Jun. 17, 2001 (Jun. 17, 2001), pp. 736-741, XP010559317, DOI: 10.1109/PESC.2001.954206, ISBN 978-0-7803-7067-8 paragraph [SectionII]; figure 3.
Cheng K W E et al: "Constant Frequency, Two-Stage Quasiresonant Convertor", IEE Proceedings B. Electrical Power Applications, 1271980 1, vol. 139, No. 3, May 1, 1992 (May 1, 1992), pp. 227-237, XP000292493, the whole document.
English Translation of the Second Office Action in counterpart to Chinese Application No. 202080018474.2, mailed Jun. 25, 2023, 11 pages.
English Translation of the Third Office Action in counterpart Chinese Application No. 202080018474.2, mailed Dec. 22, 2023, 13 pages.
Muralidhara, N., "Designing Polyphase Code for Digital Pulse Compression for Surveillance Radar," IEEE Xplore, 2017 2nd International Conference on Computing and Communications Technologies (ICCCT), Feb. 23-24, 2017, 5 pages.
Search Report as part of Notice of Registration for Chinese Application No. 202080018474.2, dated Mar. 13, 2024, 10 Pages.
Yuxiang Y., et al., "Design of Cable Open Circuit Fault Detection System Based on Single End Pulse Method", China New Telecommunications, China Academic Journal Electronic Publishing House, http://www.cnki.net, Issue 23, Dec. 5, 2017, 10 Pages.

\* cited by examiner

MULTIPLE PHASE PULSE POWER IN A NETWORK COMMUNICATIONS SYSTEM

CROSS REFERENCE TO RELATED APPLICATIONS

The present application is a continuation of U.S. application Ser. No. 16/380,954, filed Apr. 10, 2019, which in turn claims priority from U.S. Provisional Application No. 62/817,813, entitled MULTI-PHASE PULSE POWER, filed on Mar. 13, 2019, the contents of which are incorporated herein by reference in their entirety.

TECHNICAL FIELD

The present disclosure relates generally to communications networks, and more particularly, to delivery of pulse power in a communications network.

BACKGROUND

In network communications systems such as 5G cellular build-outs and connected buildings with multiple non-centralized routers on each floor, AC grid power is not always available, may not be cost effective to build out at the start or practical in some locations (e.g. wireless base stations), and in many cases cost prohibitive. Conventional PoE (Power over Ethernet) over communications cabling is limited to about 90W (watts) based on IEEE 802.3bt and does not provide enough power for higher power communications systems.

BRIEF DESCRIPTION OF THE FIGURES

Corresponding reference characters indicate corresponding parts throughout the several views of the drawings.

DESCRIPTION OF EXAMPLE EMBODIMENTS

Overview

Figure 1A:
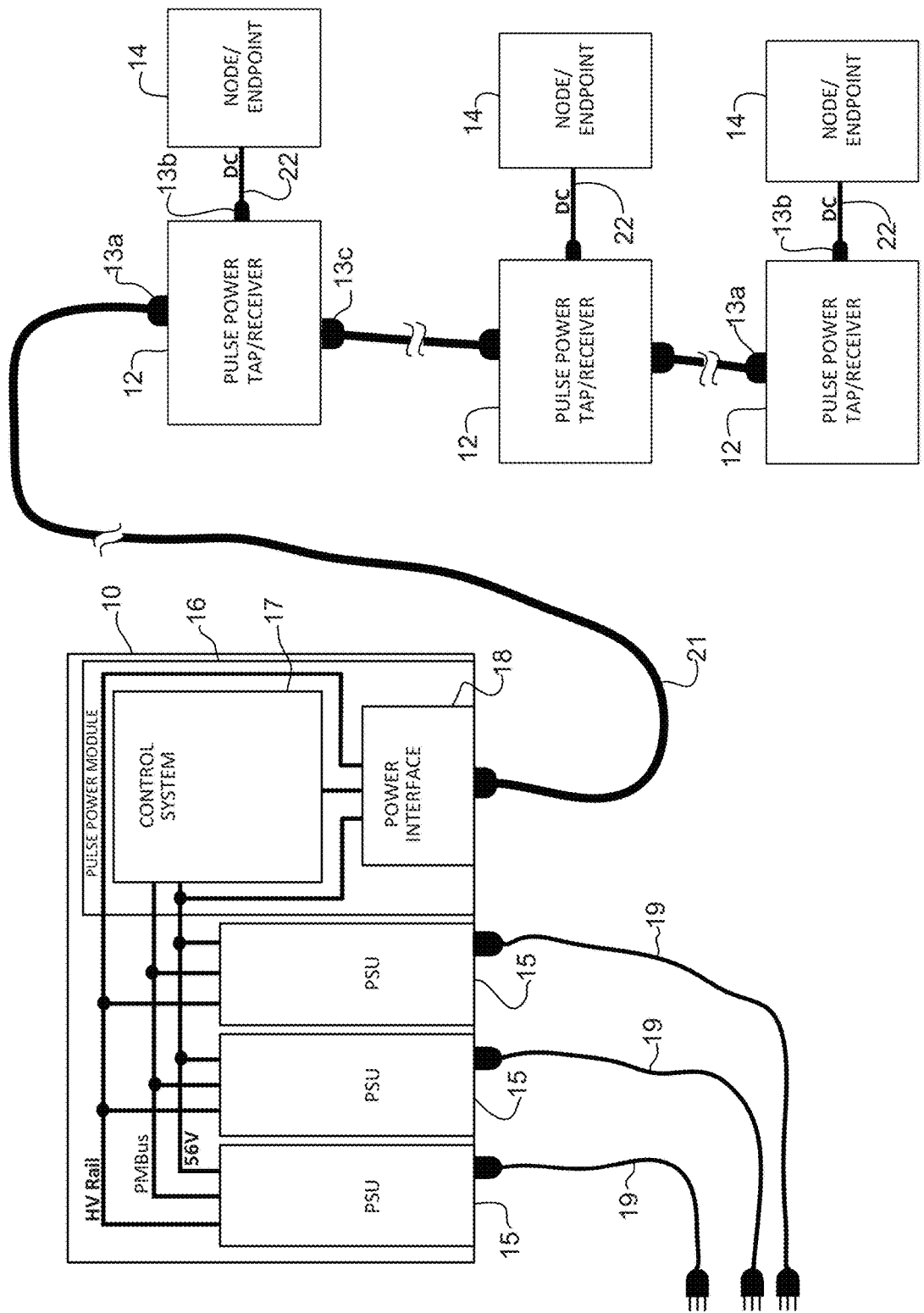
FIG. 1A is a block diagram illustrating an example of a multi-node 3-phase pulse power system, in accordance with one embodiment.

In one embodiment, an apparatus generally comprises an input power interface for receiving input power, a power control system for transmitting DC (Direct Current) pulse power on multiple phases over a cable to a plurality of powered devices and verifying cable operation during an off-time of pulses in the DC pulse power, and a cable interface for delivery of the DC pulse power on the multiple phases and data over the cable to the powered devices.

In one or more embodiments the cable comprises at least two wire pairs operating out of phase at 50% or greater duty cycle. In another embodiment, the cable comprises at least three wires for at least three phase operation and wherein continuous power is delivered to the powered devices upon loss of one of the phases. In one embodiment, each of the three wires comprises a wire pair.

In one or more embodiments, the cable further comprises a communications transmission media for bidirectional communication between the apparatus and the powered devices. In one embodiment, the communications transmission media comprises optical fibers.

In one or more embodiments, the data is transmitted over pulse power wires and provides synchronization with the powered devices.

In one or more embodiments, the power control system is operable to perform cable sensing to identify faults on the cable.

In one or more embodiments, the apparatus delivers at least 1000 Watts of power to the powered devices.

In one or more embodiments, the DC pulse power is transmitted on the cable at a voltage of at least 200 volts.

In one or more embodiments, the apparatus is configured with mid-point grounding for shock protection.

In one or more embodiments, the power control system provides continuous current and current is shared during overlap of the multiple phases.

In another embodiment, an apparatus generally comprises an input cable interface for receiving multiple phase DC pulse power and data from power sourcing equipment over a combined power and data cable, an isolation switch for fault isolation of the apparatus, and an interface for transmitting power to an endpoint node. The multiple phase DC pulse power comprises at least two phases to provide continuous DC voltage at the endpoint node and off-time of pulses in the multiple phase DC pulse power is used to verify cable operation.

In yet another embodiment, a method generally comprises receiving power at power sourcing equipment, phasing conduction of DC (Direct Current) pulse power over a plurality of wires to provide continuous DC voltage to a plurality of powered devices, transmitting multiple phase pulse power and data over a cable to the powered devices, and verifying cable operation during pulse power off-time.

Further understanding of the features and advantages of the embodiments described herein may be realized by reference to the remaining portions of the specification and the attached drawings.

EXAMPLE EMBODIMENTS

The following description is presented to enable one of ordinary skill in the art to make and use the embodiments. Descriptions of specific embodiments and applications are provided only as examples, and various modifications will be readily apparent to those skilled in the art. The general principles described herein may be applied to other applications without departing from the scope of the embodiments. Thus, the embodiments are not to be limited to those shown, but are to be accorded the widest scope consistent with the principles and features described herein. For purpose of clarity, details relating to technical material that is known in the technical fields related to the embodiments have not been described in detail.

In network communications systems such as 5G cellular build-outs or other communications systems and connected buildings with multiple non-centralized routers on each floor, AC (Alternating Current) grid power is not always available, may not be cost effective to build out at the start or practical in some locations (e.g. wireless base stations), and in many cases cost prohibitive. Conventional PoE (Power over Ethernet) over communications cabling is limited to about 90 W (watts) based on IEEE 802.3bt and does not provide enough power for higher power communications systems such as remote radio heads or front haul routers as seen in cellular networks that typically need between 300 W and 1000 W to operate. Also, enterprise products that provide switching, routing, and power for access points and IP (Internet Protocol) phone systems often need about 1000 W to 1500 W of power.

There is a need for a means to deliver power to these and other devices (e.g., over 1000W, over several 100*m* (meters) to over 1000 meters) without having to add an AC outlet or other type of secondary power feed. In locations that are listed as "co-location", power is typically charged on a per connection basis, not consumed power, making each additional AC connection very expensive. AC grid power systems are often used because DC (Direct Current) power systems are not a good solution over long distances.

In order to increase available power, high voltage pulses (referred to as pulse power or pulsed power) may be used. One option is to deliver power using pulse power techniques over communications cables using a single pair of copper wires (e.g., 14AWG (American Wire Gauge), 16AWG twisted or semi twisted pairs, or other suitable wires). However, this approach has significant limitations due to high RMS (Root Mean Square) (effective) current in the cable and the extremely bulky filter components needed at a powered device end of the system. These limitations impact the size of end equipment and distance the power can be transmitted, making this solution unfeasible for small foot print build-outs of communications infrastructure.

A single phase pulse power system may have a difficult time meeting one or more safety requirements because there is typically a 2 ms to 4 ms off-time (off-time between power pulses) needed to properly assess environmental safety within a 10 ms window, yet still maintain reasonable power efficiency. Additional pulse power limitations include that pulse power needs off-time for safety auto-negotiation and practical cable capacitance and inductance demand low pulse repetition rates (e.g., on the order of 10 Hz (hertz) or 100 Hz). This low frequency operation results in a need for high value filter components to produce the needed DC output voltage to produce smooth DC system voltages. These inductor and capacitor filter components are physically large (bulky and costly). Long or high capacitance cables result in even lower frequency or low duty cycle operation, resulting in a need for even larger filter components. Low duty cycles need higher pulse currents and/or voltages, creating higher RMS currents and higher cable losses with lower efficiency. This also increases radiated EMI (Electromagnetic Interference)/EMC (Electromagnetic Compatibility) noise fields and emissions. Low duty cycle operation creates high power losses with high transmission line RMS current, thereby restricting transmission distance.

The embodiments described herein overcome the above limitations through the of use multiple phase (multi-phase) pulse power to achieve less loss, effectively 100% duty cycle power delivery (e.g., continuous uninterrupted power to the output with overlapping phase pulses) to a powered device, while enhancing reliability per power connection and providing safe operation over an extended length of cable to deliver high power. One or more embodiments use multiple pair cabling to place a DC pulse on each pair, timed in such a manner as to provide 100% net duty cycle continuous power at the powered device (or load). Pulse power transmissions may be through cables, transmission lines, busbars, backplanes, PCBs (Printed Circuit Boards), and power distribution systems, for example.

In one or more embodiments, single conductor pair cable is replaced with 2-phase pulse power transmission system cable with two pairs of power lines, busbars, power planes, or cable wired pairs. One or more embodiments comprise a 2-phase pulse power transmission system cable with 3-wire, busbars, power planes, or a cable wire trio. Multi-phase (three or more phase) operation may further reduce RMS current per phase and effectively provide continuous DC voltage without bulky filter components. In one or more embodiments, high or effectively 100% duty cycle to the output and split ground (e.g., mid-point high-resistance ground) may provide higher efficiency with lower RMS current cable losses, allow fast and effective phase to ground fault detection, allow for higher voltage and power to the load from limited cable voltage rating, and implement common mode systems (separate ground connection) with lower peak currents for lower EMI/EMC noise radiated and susceptible fields.

In one or more embodiments, the multiple phase approach allows for a significant off time in a 10 ms window, for example, to verify the cable for shorts, opens, unreported power loss (e.g., low current short), or human or animal added resistance. This extended off-time allows for a significant improvement in safety. The multi-phase pulse power also allows for a lower source voltage to be used to meet 100% of the powered device requirements. As previously noted, in a single phase system, the off-time needs to be filtered out with bulky filters, and even then, power efficiency/effectivity is about 80% on high loads. Use of multiple phases at a higher duty cycle and higher efficiency provides a significant component advantage and may also provide increased power delivery and reliability. For example, the loss of a single phase in a three or more phase system does not impact the 100% continuous duty cycle power effectivity at the powered device. As described below, loss of a sourced phase front end circuit may not impact operation with redundant power sources.

In one or more embodiments, PSE (Power Sourcing Equipment) may deliver >100 W to a plurality of PDs (Powered Devices) along with data (e.g., over copper wires or optical fibers) on a power and data combined cable. In one or more embodiments, the system may safely deliver 2000 W or more of power at cable lengths exceeding 1500 meters. The system may also safely deliver higher power (e.g., 6000 W) on cable lengths less than 25 meters, making it very valuable in de-centralizing large chassis systems to eliminate the back plane/large chassis system design. It is to be understood that the power levels and cable distances described herein are provided as examples and other power levels delivered over different cable lengths may be used without departing from the scope of the embodiments.

Referring now to the drawings and first to FIG. 1A, a multi-node multi-phase pulse power block diagram is shown, in accordance with one embodiment. The simplified example shown in FIG. 1A includes a PSE node 10 delivering power to three or more PDs (e.g., pulse power tap/receiver 12 and node endpoint 14). In this example the pulse power tap/receiver 12 is separate from the endpoint equipment 14, however, these nodes may be combined. Also, there may be more than one node 14 connected to one or more of the pulse power tap/receivers 12.

The PSE network device 10 comprises an input power interface (e.g., three PSUs 15 receiving power cords 19 in the example shown in FIG. 1A) for receiving input power, a power control system 17 for receiving the input power and transmitting DC pulse power on multiple phases over a cable 21 to a plurality of the powered devices 12, 14 and verifying cable operation within off-time of pulses in the DC pulse power, and a cable interface (e.g., power interface 18) for delivery of the multi-phase DC pulse power and data (e.g., control data, bidirectional communications, on copper wire or optical fiber) over the cable 21.

Figure 11:
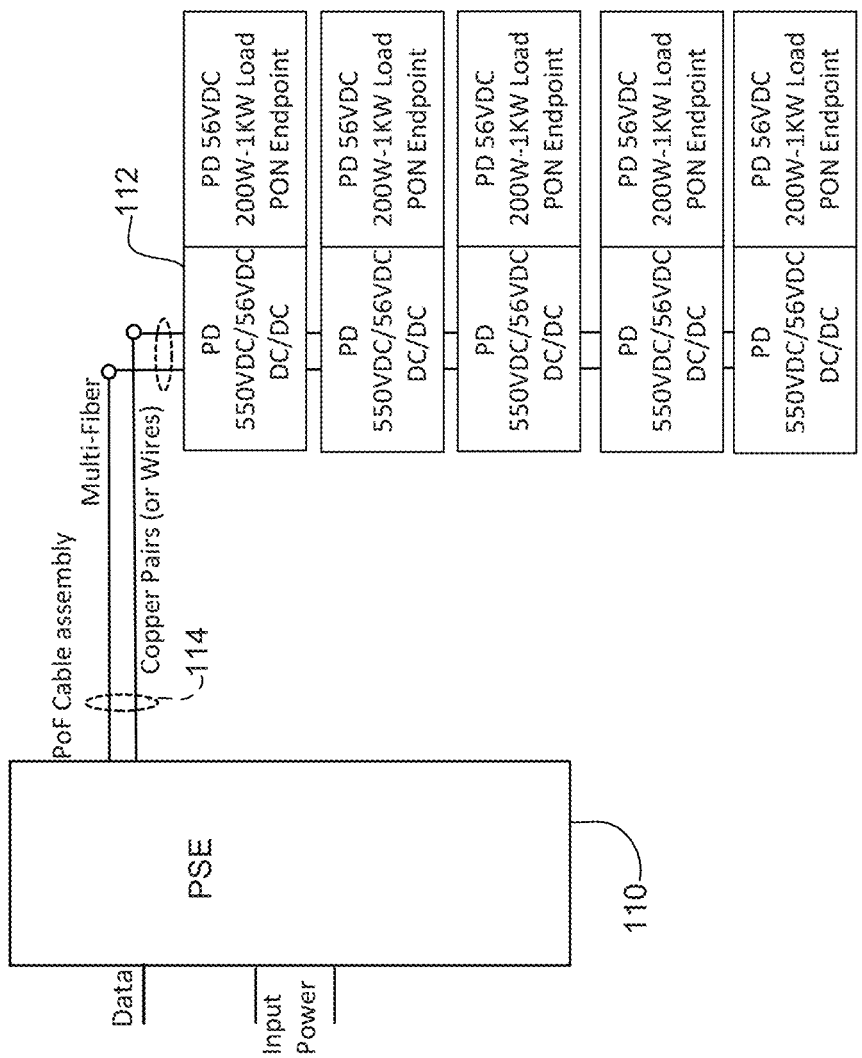
FIG. 11 illustrates an example of multi-phase pulse power and data distribution to a plurality of powered devices, in accordance with one embodiment.

The pulse power tap/receiver 12 comprises an input cable interface 13*a* for receiving the multiple phase DC pulse power and data from the PSE 10, an isolation switch (described below), and an interface 13*b* for transmitting power to the endpoint node 14. The interface 13*b* may be, for example, an interface connected to HVDC cable 22, pulse power cable, or a direct interface to the endpoint node (e.g., as shown in FIG. 11). The tap/receiver 12 may supply power to one or more nodes 14 along a pulse power cable system. The tap/receivers 12 may be sized to support individual node power and may implement disconnect for fault isolation or node control based on data link communications. The multiple phase (multi-phase) DC pulse power comprises at least two phases to provide continuous DC voltage at the endpoint node 14. In one or more embodiments, the multi-phase pulse power comprises at least three phases to provide continuous power in case of loss of one phase. One or more of the pulse power tap/receivers 12 also comprises an output cable interface 13*c* for transmitting the multiple phase DC pulse power and data on the cable to a downstream tap node 12 in a taper topology (tap node configuration).

In the example shown in FIG. 1A, the PSE 10 comprises three PSUs 15 and a pulse power module 16 comprising the control system 17 and the power interface 18. As shown in FIG. 1A, each PSU 15 may be in power communication with the pulse power module 16 over a high voltage rail, PM (Power Management) bus line, 56V line, or any combination thereof. In one example, each PSU 15 is configured for 1200 W power to provide redundancy and allow for the use of standard 15A (amp) power cords/branch circuits. In one example, the PSE 10 is operable to deliver >1500W total power to the nodes 14. In one example 190V line-to-ground (380V total) eliminates the need for intermediate power conversions.

The pulse power module control system 17 may provide, for example, timing and sequencing, line detection and characterization, voltage and current sensing, mid-point high resistance grounding, fault sensing, communications to PSUs, and data link/control to remote nodes. As described below, the control system 17 may verify cable operation (e.g., verify cable operational integrity) during the off-time of pulses in the DC pulse power. The pulse power module 16 may include a pulse power modulator, safety circuits, initialization circuits, PMBus, PMBus I2C (I2C (Inter-Integrated Circuit)), logic, FPGA (Field-Programmable Gate Array), DSP (Digital Signal Processor), or any combination of these or other components configured to perform the functions described herein.

As shown in the example of FIG. 1A, the PSUs 15 receive AC power on cables 19 and deliver pulse power on cable 21. In one or more embodiments, the pulse power tap/receiver 12 may combine the phases and deliver high voltage (HV) DC power to the node/endpoint 14 on cable 22. In another embodiment, the pulse power tap/receiver 12 may deliver pulse power to the endpoint 14 on the cable 22. In one or more embodiments, the pulse power cable 21 includes two or more optical fibers for delivering data in the combined power and data cable, as described below. In one example, there may be a dedicated fiber (or fibers) per branch.

The wires within cable 21 may comprise two conductor, twisted pair (with or without shielding), coaxial or triaxial cable, depending on EMC considerations. A separate ground conductor may be provided to address potential common-mode noise issues. It is to be understood that the term wire as used herein may refer to a single wire or a pair of wires. As described below, the power system may comprise any number of wires, which may be bundled with fiber or other communications transmission media.

Power is supplied to the endpoint 14 through the pulse power tap/receiver 12 (also referred to as a branch tap, smart branch tap, receiver/converter). In one or more embodiments, the smart branch taps 12 allow branch fault isolation. The tap/receiver 12 may include, for example, an isolation switch (disconnect switch), data link, and logic/timing controller. The tap/receiver 12 may be used for initializing an auto-negotiation process, fault branch isolation algorithm, power initialization, and faulty PD replacements. The data link over the pulse power wires allows for implementation of the smart branch taps 12 for each node 14 and independent control (disconnect) of each branch for fault isolation or node management.

Each of the endpoints 14 may include an HVDC PSU for powering equipment at the endpoint. The endpoint 14 may comprise, for example, a 56 VDC load and may operate, for example, as a PON (Passive Optical Network) endpoint, 5G node, access point, router, switch, or other type of equipment. The endpoint 14 may also power one or more other nodes (e.g., PoE node, IoT (Internet of Things) device).

Figure 1B:
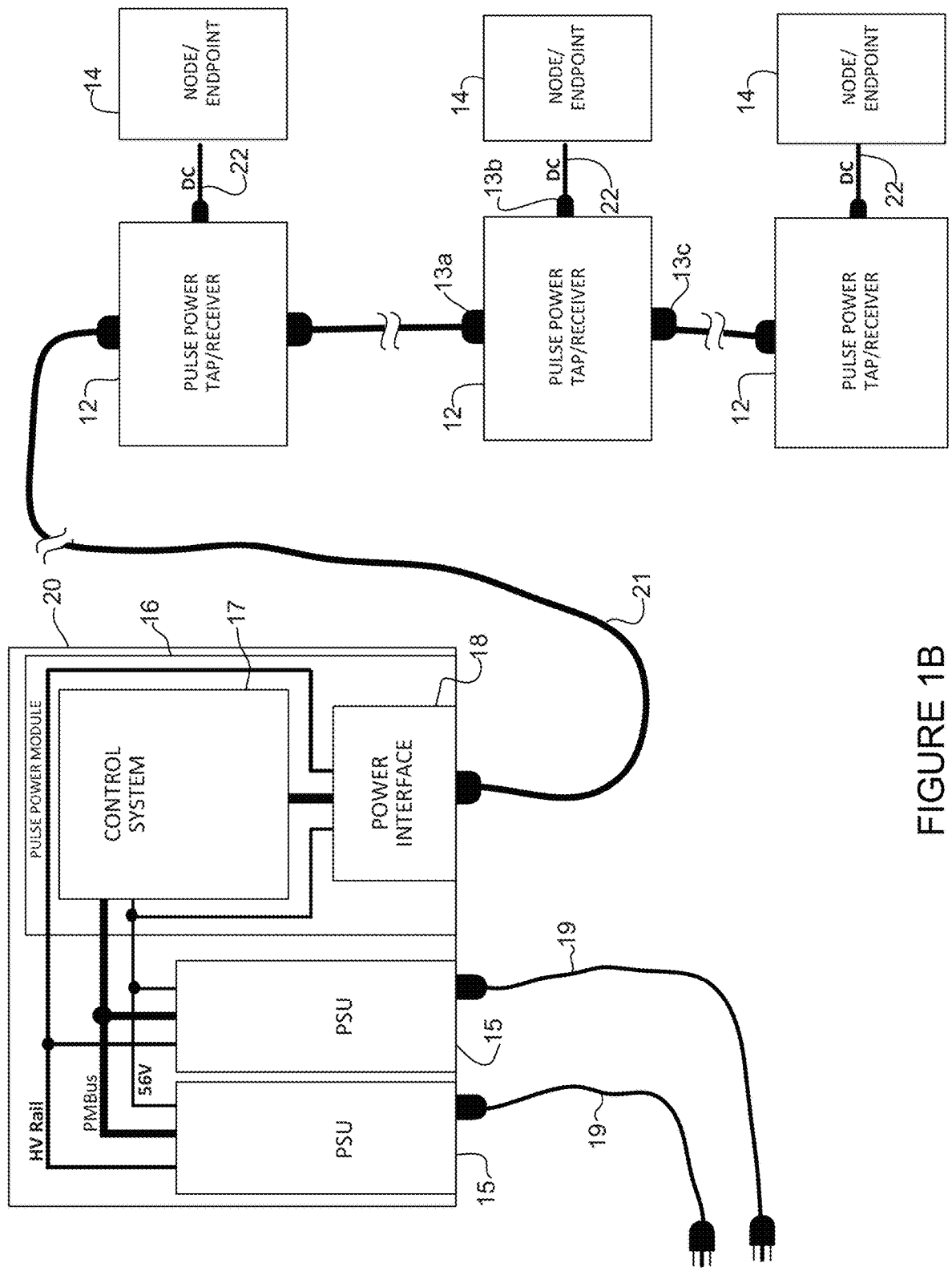
FIG. 1B is a block diagram illustrating an example of a multi-node 2-phase pulse power system, in accordance with one embodiment.

FIG. 1B illustrates a multi-node pulse power block diagram with a PSE 20 comprising two PSUs 15 for providing 2-phase pulse power. It is to be understood that the network topologies and nodes shown in FIGS. 1A and 1B are only examples and that the network may comprise different topologies and network devices without departing from the scope of the embodiments.

As previously described, the multiple PSUs allow for multi-phase operation and may also provide redundancy. For example, if one phase is lost in a system comprising three or more phases, continuous power may still be delivered to the PD nodes 14. Each phase is preferably sized to supply higher peak power to maintain full power to the PD nodes 14. Further redundancy may be provided by utilizing N+1 Front End Power (FEP) supplies. For example, in the case of a 1500 W total PD power system, three 1200 W FEPs can power the system with full redundancy of N+N or N+1, with each FEP needing only a common 120V, 15A feed.

Figure 2A:
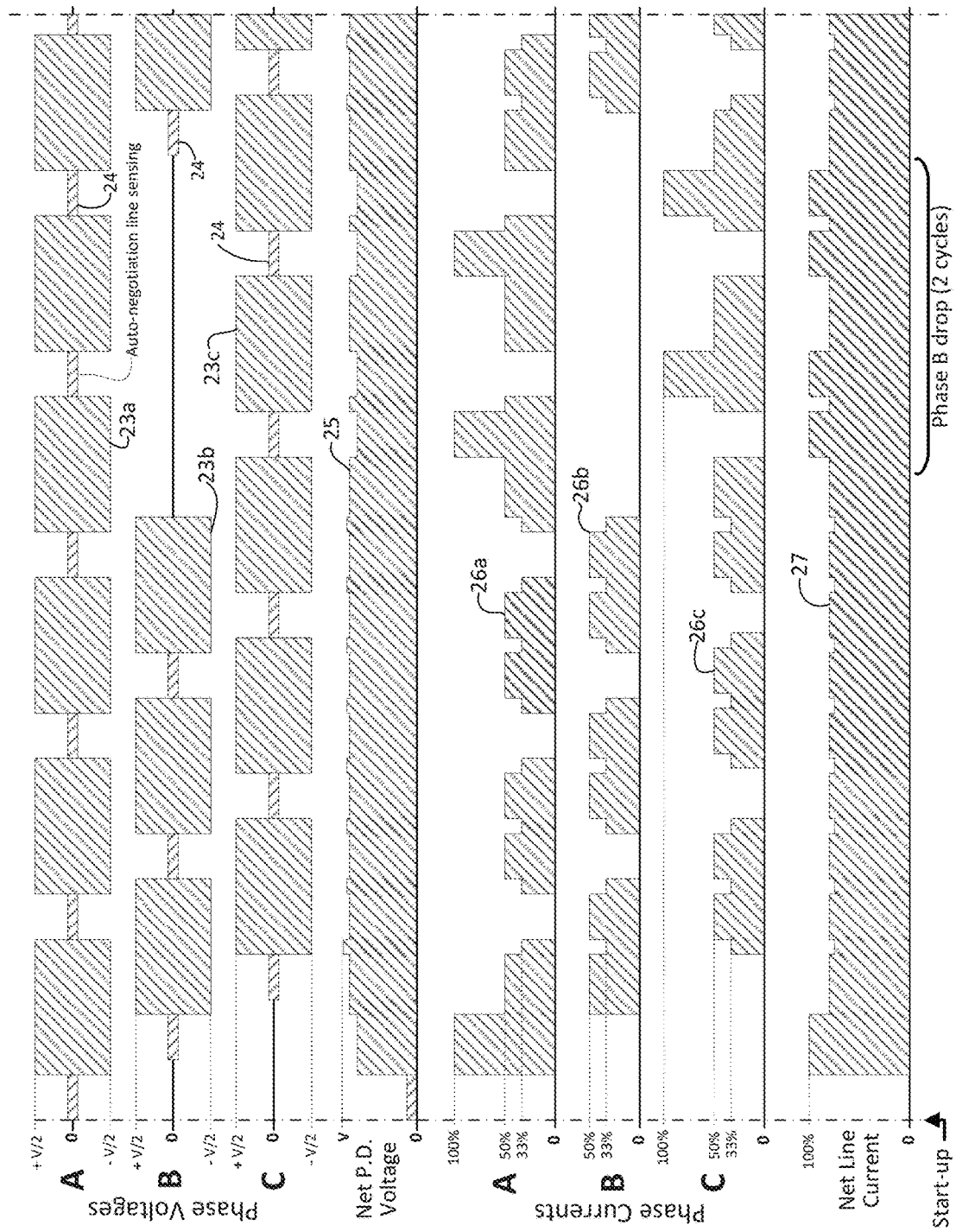
FIG. 2A illustrates an example of 3-phase pulse power voltage and current for the system shown in FIG. 1A with constant power loading from endpoint nodes.

FIG. 2A illustrates an example of 3-phase pulse power voltage and current with a 75% duty cycle with phase drop delivered in the system shown in FIG. 1A, for example. Idealized waveforms are shown and net PD voltage and line current include line loss effect with constant power loading from the nodes/endpoints 14. In the example shown in FIG. 2A, phase B drops out for two cycles. The three phase voltages (A, B, and C) (23a, 23b, 23c) are shown with auto-negotiation line sensing 24.

As shown in FIG. 2A, during pulse on-time high voltage power is delivered from the PSE to the PDs and during pulse off-time while the high voltage power is off, a low voltage may be applied on each phase for use in low voltage sensing (indicated at 24) to check wire integrity.

The net PD voltage is shown combined for the three phase voltages at 25. The corresponding phase currents (A, B, C) (26a, 26b, 26c) are shown below the voltages. The net line current corresponding to the three phase currents is shown at 27. As shown in FIG. 2A, if one phase is lost (as shown at phase B drop), continuous power is still delivered to the PD nodes. Each phase may be sized to supply higher peak power to maintain full power to the PDs.

Figure 2B:
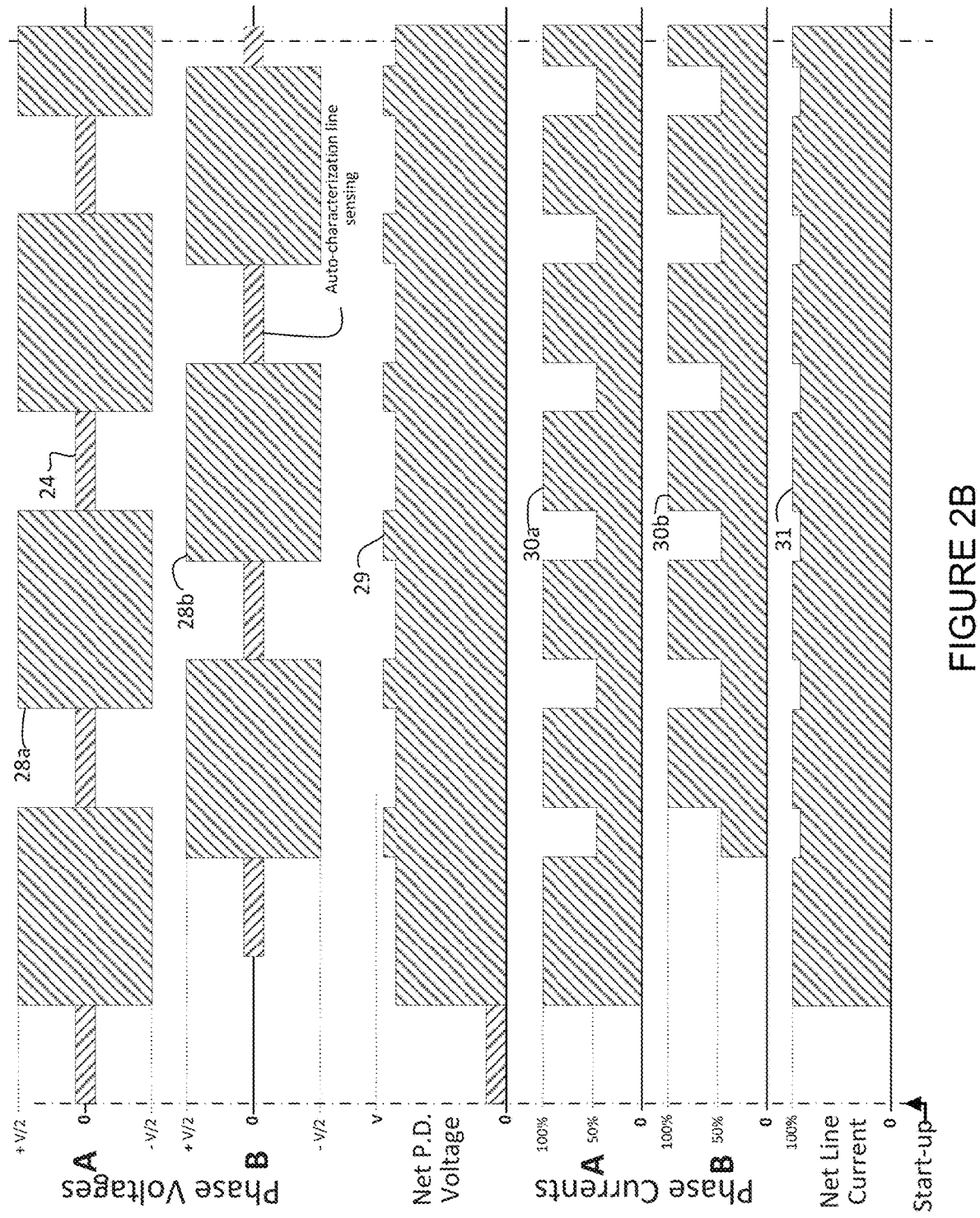
FIG. 2B illustrates an example of 2-phase pulse power voltage and current for the system shown in FIG. 1B with constant power loading from endpoint nodes.

FIG. 2B illustrates an example of 2-phase pulse power voltage and current with a 66% duty cycle delivered in the system shown in FIG. 1B, for example. Idealized waveforms are shown and net PD voltage and line current include line loss effect with constant power loading from the nodes/endpoints 14. The two phase voltages (A, B) (28a, 28b) are shown with auto-negotiation line sensing 24. The net PD voltage is shown combined for the two phase voltages at 29. The corresponding phase currents (A, B) (30a, 30b) are shown below the voltages. The net line current corresponding to the two phase currents is shown at 31.

As shown in FIGS. 2A and 2B, two or more transmission wires (e.g., wires or wire pairs) enable phasing of the conduction on each wire (e.g., wire or pair) so that at least one wire is ON at any time. When OR'd at the PD, the result is continuous DC voltage as shown at 25 and 29, thereby eliminating the need for bulky filter components. During phase overlap in the multi-phase systems, the total cable current is shared across all ON wires. Individual transmission wire current is proportionally reduced, lowering total transmission cable losses.

The off-time of the pulses may configured based on cable pair capacitance and maximum pulse power on-time may be designed to be below limits set by body shock current and standards (e.g., as referenced in UL (Underwriters Laboratories) standards 62368 and 60950 or NFPA (National Fire Protection Association) NEC (National Electrical Code) 70 chapter 7, chapter 8, and tables 11A and 11B in chapter 9, IEC/TR 60479-5, IEC-60947-1, and IEC-60947-2, or any other appropriate standard or requirement). In one or more embodiments, on-time and off-time pulse widths may be set dynamically in response to changing cable characteristics. The need for continuous net current supply to the PD may determine the phase relationship of pulses on multiple transmission pair systems.

In one or more embodiments, the off-time may be fixed, based on worst case cable length and characteristics or actively controlled based on detected cable characterization (for higher efficiency/longer range). The on-time (power delivery) for each phase may be fixed based on total pulse power voltage and shock hazard limits based on appropriate body resistance data. This approach may be used to achieve maximum pulse overlap, thereby reducing cable RMS current and maximizing power transmission distance (or minimizing conductor wire size).

As previously noted, idealized waveforms are shown in FIGS. 2A and 2B. Inductance in the PSE 10, cable 21, and PD receiver 12 may create some averaging of cable currents, raising overlap currents and lowering current during pulse off-time (FIG. 1). This effect may vary with cable length and type (inductance). Phase currents shown in FIGS. 2A and 2B do not show this effect.

It is to be understood that the currents, voltages, pulse widths, duty cycles, and phase overlaps shown in FIGS. 2A and 2B and described above are only examples and may be different than shown or described herein. For example, there may be a higher pulse current during overlap and lower current during non-overlap. The differences may be dependent on pulse power transmission inductance and capacitance (e.g., length of run or type of cable), for example. Also, the safety standards and requirements described herein are only examples and the system may be designed to meet other safety standards, requirements, or limits.

As previously noted, the multi-phase pulse power system may comprise two or more wires or wire pairs. FIGS. 3, 5, 7A and 8A show examples of multi-phase circuits comprising two wire pairs, three wires, three wire pairs, and four wire pairs, respectively. It is to be understood that these are only examples and the multi-phase system described herein may be implemented on systems comprising a different number of wires or wire pairs, without departing from the scope of the embodiments. Also, as previously described, the cable may include any number of optical fibers or additional copper wires for data transmission.

Figure 3:
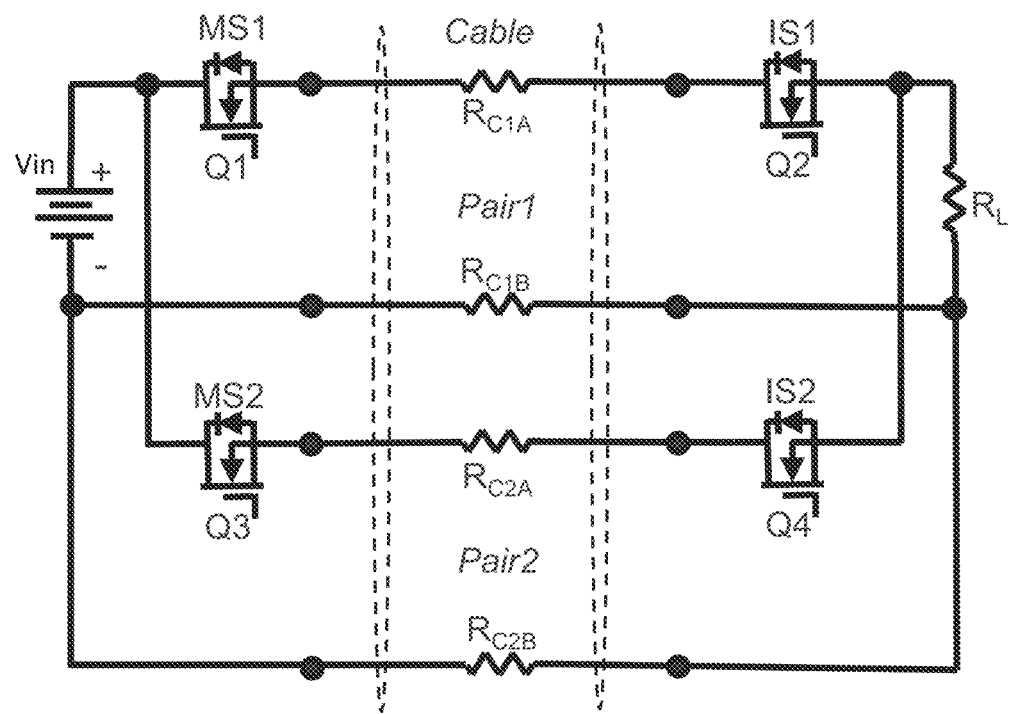
FIG. 3 illustrates an example of a circuit with a 2-phase, 2-pair cable for delivery of multi-phase pulse power, in accordance with one embodiment.

FIG. 3 shows an example of a 2-phase 2-pair cable. The simplified circuit shown in FIG. 3 comprises two modulator switches (MS1 (Q1), and MS2 (Q3)) and two isolation switches (IS1 (Q2) and IS2 (Q4)). As described below with respect to FIG. 10, the modulation switches are located at the PSE along with the voltage input (Vin), and the isolation switches are at the PD. In this example, the cable includes two wire pairs (Pair 1, Pair 2), with each pair having resistance ($R_{C1A}$, $R_{C1B}$ at Pair 1, $R_{C2A}$, $R_{C2B}$ at Pair 2). $R_L$ represents the load at the PD. The switches Q1, Q2, Q3, and Q4 may comprise any suitable actively controlled switching device capable of operating at the desired switching frequency, such as a Metal Oxide semiconductor Field Effect Transistor (MOSFET), a Bipolar Junction Transistor (BJT), a Gallium Nitride Field Effect Transistor (GaNFET), or a solid state relay (SSR). Closing and opening of the switch may be managed by control logic coupled to the switch (not shown). The control logic may be part of a processor or a separate integrated circuit.

Figure 4A:
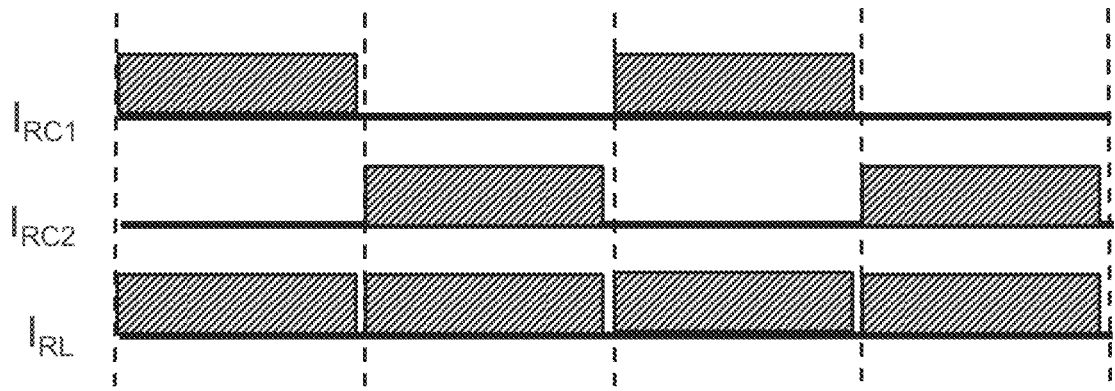
FIG. 4A illustrates a pulse current with phase shifted pulse duty cycle and discontinuous current for the circuit shown in FIG. 3.
Figure 4B:
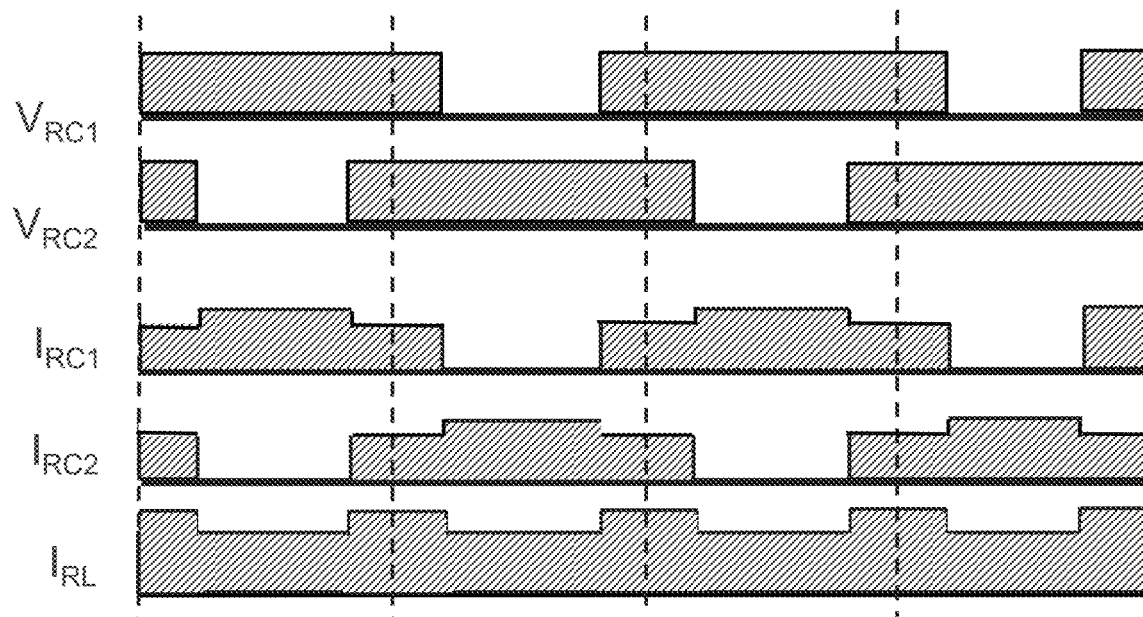
FIG. 4B illustrates a pulse current with phase shifted pulse duty cycle and continuous current for the circuit shown in FIG. 3.

FIG. 4A illustrates pulse current with phase shifted pulse duty cycle, which allows smooth DC output with minimal filtering. The example shown in FIG. 4A uses a discontinuous current. FIG. 4B illustrates pulse current with >50% pulse duty cycle per phase, which provides smooth DC output with no filter. A simplified design example of long off-time for auto-negotiation is shown in FIGS. 4A and 4B. FIGS. 4A and 4B both show current $I_{RC1}$ and $I_{RC2}$ at resistors $R_{C1A}/R_{C1B}$ and $R_{C2A}/R_{C2B}$, respectively, in FIG. 3. Current $I_{RL}$ shows the net line current at $R_L$ in FIG. 3. FIG. 4B also shows voltage $V_{RC1}$ and $V_{RC2}$ at resistors $R_{C1A}/R_{C1B}$ and $R_{C2A}/R_{C2B}$, respectively, in FIG. 3.

Figure 5:
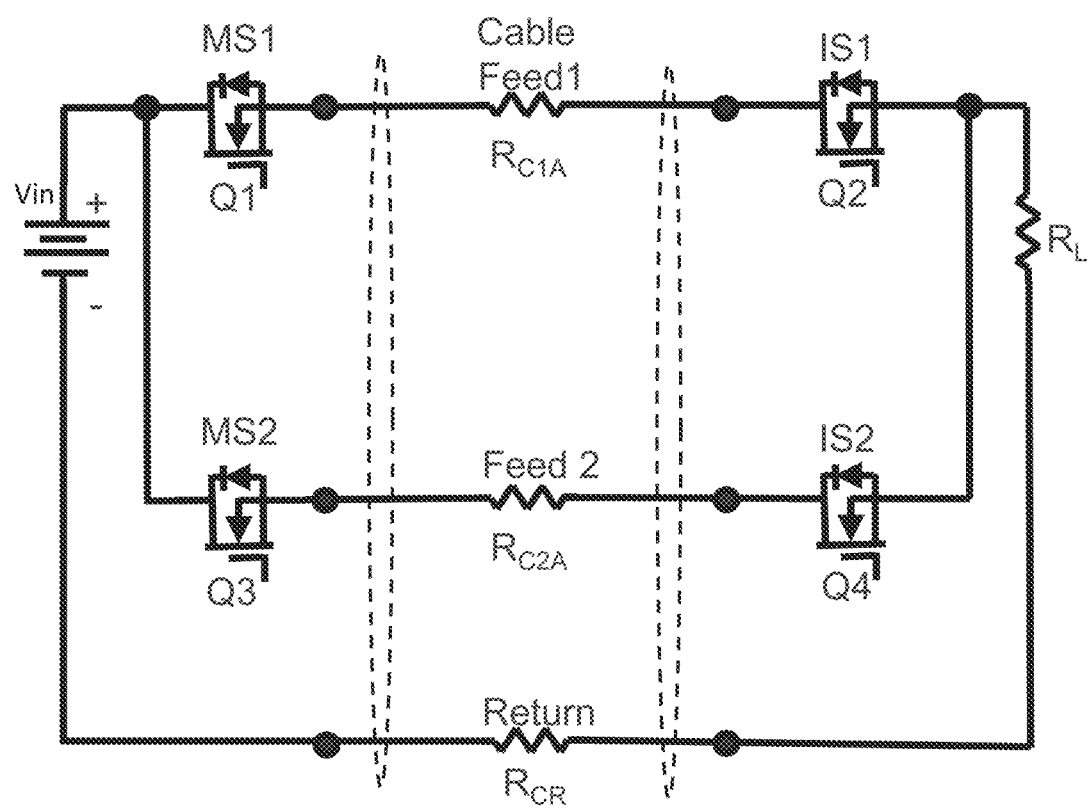
FIG. 5 illustrates an example of a circuit with a 2-phase, 3-wire cable for delivery of multi-phase pulse power, in accordance with one embodiment.

FIG. 5 illustrates a 2-phase 3-wire cable, in accordance with one embodiment. The cable includes resistance $R_{C1A}$, $R_{C2A}$, and $R_{CR}$ in Feed 1, Feed 2, and Return wires, respectively. Each feed line includes a modular switch (MS1 (Q1), MS2 (Q3)) and isolation switch (IS1 (Q2), IS2 (Q4)), as previously described with respect to the wire pairs FIG. 3. The PSE includes input voltage Vin and RL represents the load at the PD.

Figure 6A:
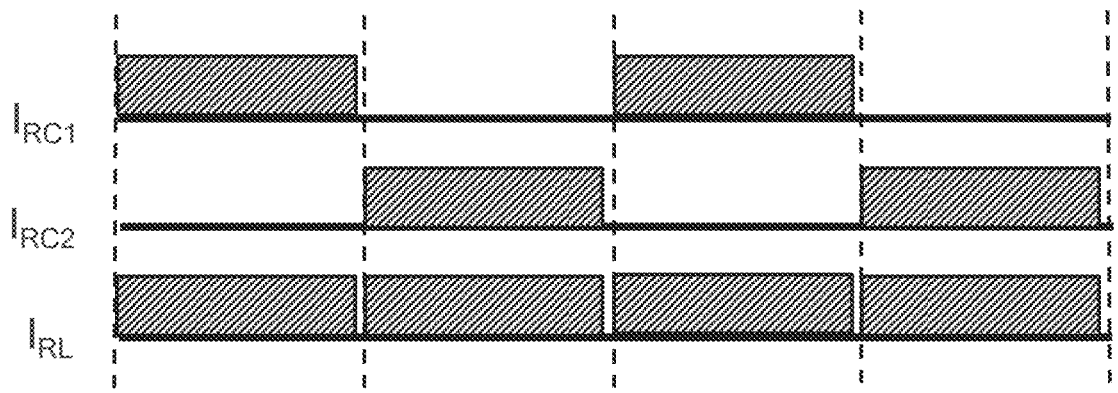
FIG. 6A illustrates a pulse current with phase shifted duty cycle and discontinuous current for the circuit shown in FIG. 5.
Figure 6B:
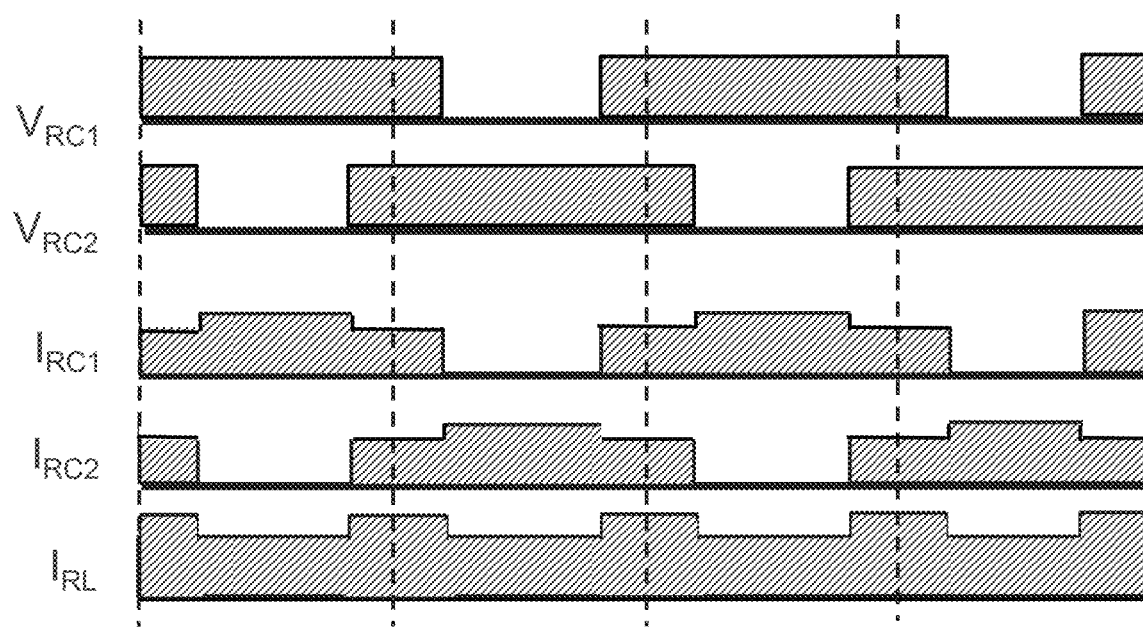
FIG. 6B illustrates pulse voltage and current with phase shifted duty cycle and continuous current for the circuit shown in FIG. 5.

FIGS. 6A and 6B illustrate a simplified design example of long off-time for auto-negotiation in the circuit of FIG. 5. FIG. 6A shows discontinuous pulse current with phase shifted pulse duty cycle, which allows smooth DC output with minimal filter. FIG. 6B shows continuous pulse current with >50% duty cycle. Current $I_{RL}$ at the load is continuous and filtering is reduced or eliminated with the continuous current. FIGS. 6A and 6B both show current $I_{RC1}$ and $I_{RC2}$ at resistors $R_{C1A}/R_{C1B}$ and $R_{C2A}/R_{C2B}$, respectively, in FIG. 5. Current IRL shows the net line current at RL in FIG. 5. FIG. 6B also shows voltage $V_{RC1}$ and $V_{RC2}$ at resistors $R_{C1A}/R_{C1B}$ and $R_{C2A}/R_{C2B}$, respectively, in FIG. 5.

Figure 7A:
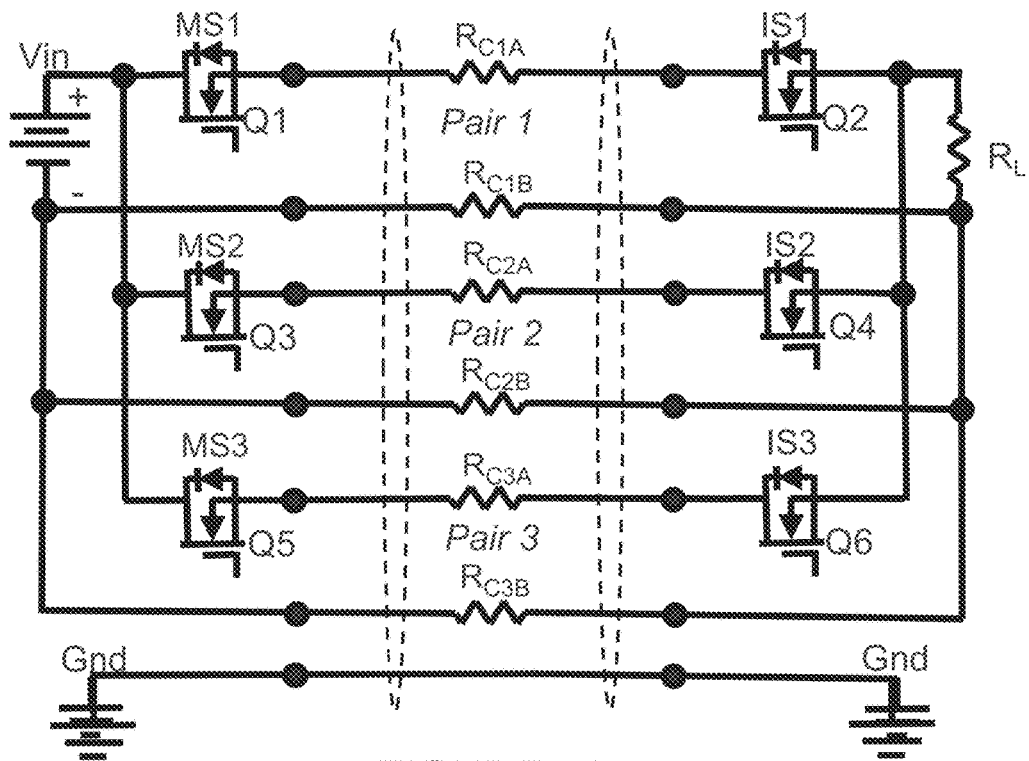
FIG. 7A illustrates an example of a circuit with a 3-phase, 3-pair cable for delivery of multi-phase pulse power, in accordance with one embodiment.

FIG. 7A illustrates an example circuit for a 3-phase, 3-pair system. The cable includes three wire pairs (Pair 1, Pair 2, Pair 3) and ground (Gnd). Each pair includes resistance ($R_{C1A}$, $R_{C1B}$ at Pair 1, $R_{C2A}$, $R_{C2B}$ at Pair 2, $R_{C3A}$, $R_{C3B}$ at Pair 3). Input voltage Vin at the PSE is shown and RL represents the load at the PD. The circuit includes three modulator switches (MS1 (Q1), MS2 (Q3), and MS3 (Q5)) and three isolation switches (IS1 (Q2), IS2 (Q4), and IS3 (Q6)). The separate ground wire (Gnd) or shield may be included for EMC control.

Figure 7B:
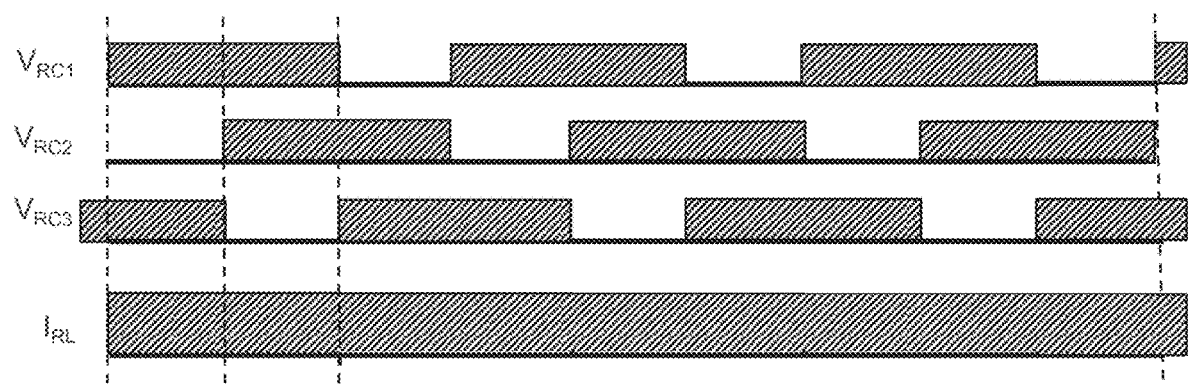
FIG. 7B illustrates pulse voltage and current with a 67% load duty cycle and continuous current for the circuit shown in FIG. 7A.

FIG. 7B illustrates a simplified design example of long off-time for auto-negotiation in the circuit of FIG. 7A with continuous current. A pulse current with 67% load duty cycle is shown in the example of FIG. 7B. Current IRL is continuous and filtering is reduced or eliminated. Any single phase may be lost with minimal effect on continuous DC output, as previously described with respect to FIG. 2A.

Figure 8A:
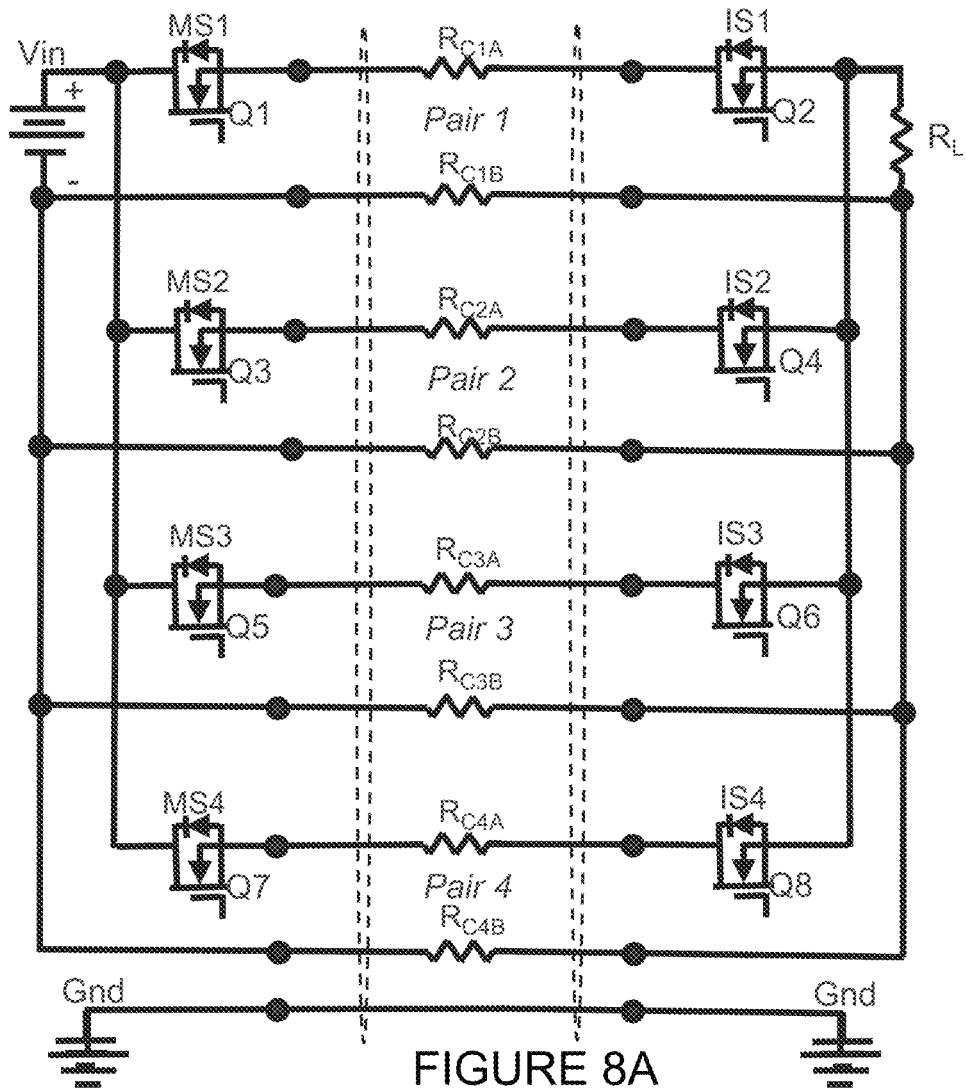
FIG. 8A illustrates an example of a circuit with a 4-phase, 4-pair cable for delivery of multi-phase pulse power, in accordance with one embodiment.

FIG. 8A illustrates an example circuit for a 4-phase, 4-pair system. The cable includes four wire pairs (Pair 1, Pair 2, Pair 3, Pair 4) and ground (Gnd). Each pair includes resistance ($R_{C1A}$, $R_{C1B}$ at Pair 1, $R_{C2A}$, $R_{C2B}$ at Pair 2, $R_{C3A}$, $R_{C3B}$ at Pair 3, $R_{C4A}$, $R_{C4B}$ at Pair 4). Input voltage Vin at the PSE is shown and RL represents the load at the PD. The circuit includes four modulator switches (MS1 (Q1), MS2 (Q3), MS3 (Q5), and MS4 (Q7)) and four isolation switches (IS1 (Q2), IS2 (Q4), IS3 (Q6), and IS4 (Q8)). The separate ground wire (Gnd) or shield may be included for EMC control. This example may be implemented in standard 4-pair cables, for example.

Figure 8B:
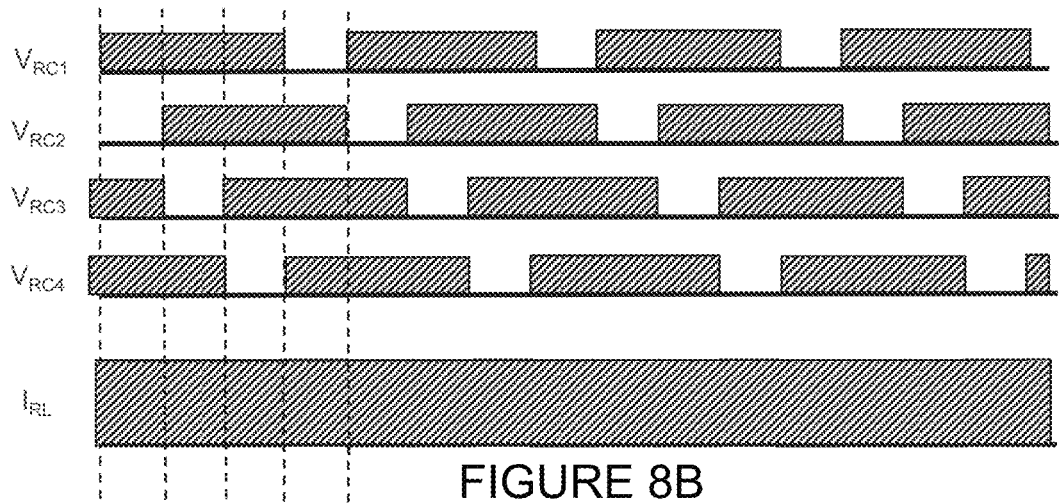
FIG. 8B illustrates pulse voltage and current with 75% duty cycle and continuous current for the circuit shown in FIG. 8A.

FIG. 8B illustrates a simplified design example of long off-time for auto-negotiation in the circuit shown in FIG. 8A with continuous current. The example shown in FIG. 8B includes a pulse current with 75% duty cycle. Current IRL is continuous and filtering is reduced or eliminated. RMS current per conductor is also reduced. Up to two phases may be lost with minimal effect on continuous DC output.

Figure 9:
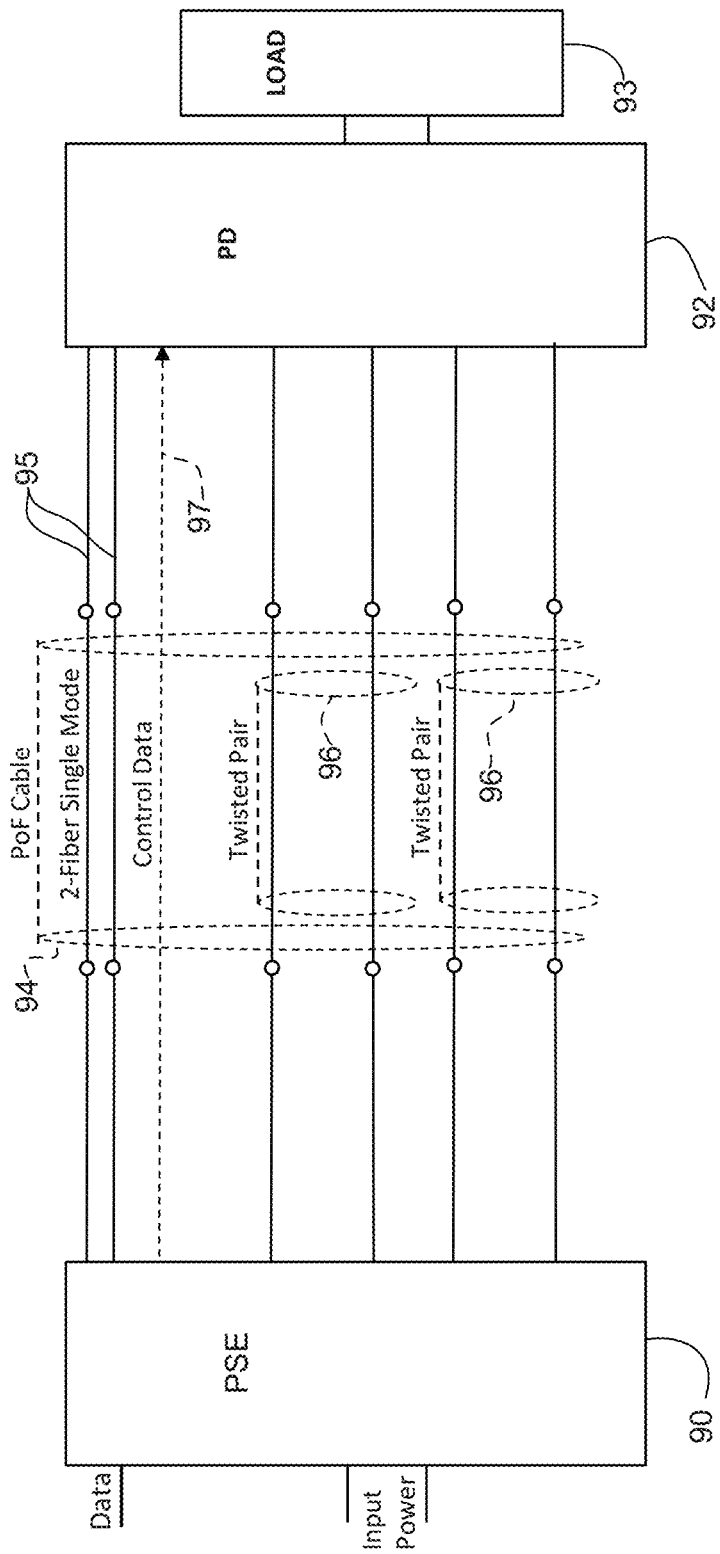
FIG. 9 is a block diagram illustrating a cable with optical fibers and two twisted wire pairs for delivery of data and multi-phase pulse power, in accordance with one embodiment.

FIG. 9 illustrates a simplified example of a data and power delivery system comprising a PSE 90 in communication with PD 92 providing power to a load 93, over a combined power and data cable (e.g., Power over Fiber (PoF) cable) 94. In this example, the cable 94 includes two optical fibers 95 (e.g., 2-fiber single mode) and two twisted pairs 96 (e.g., copper wires). Control data shown at 97 may be delivered over the optical fibers 95 or copper wires (twisted pairs) 96, or a separate transmission line. The control data may comprise, for example, isolation switch synchronization control data, bidirectional control data, or other PD synchronization data. Bidirectional communications data may also be transmitted over the optical fibers 95 or wires 96. In one example, 10 MB communications are provided over a copper pair during high voltage on pulse (e.g., on high voltage data link). Input power (e.g., AC, HVAC, HVDC, line card 48-56 VDC) may be provided at the PSE 90. As described below, the system may also be configured with one or more safety features including shock protection. In one example, the system may be configured to provide 2000 W power on copper pairs 96 over 1 km with 550 VDC pulse power. The cable may comprise any number of optical fibers and wires or wire pairs and may deliver other power levels over different lengths of cable.

Figure 10:
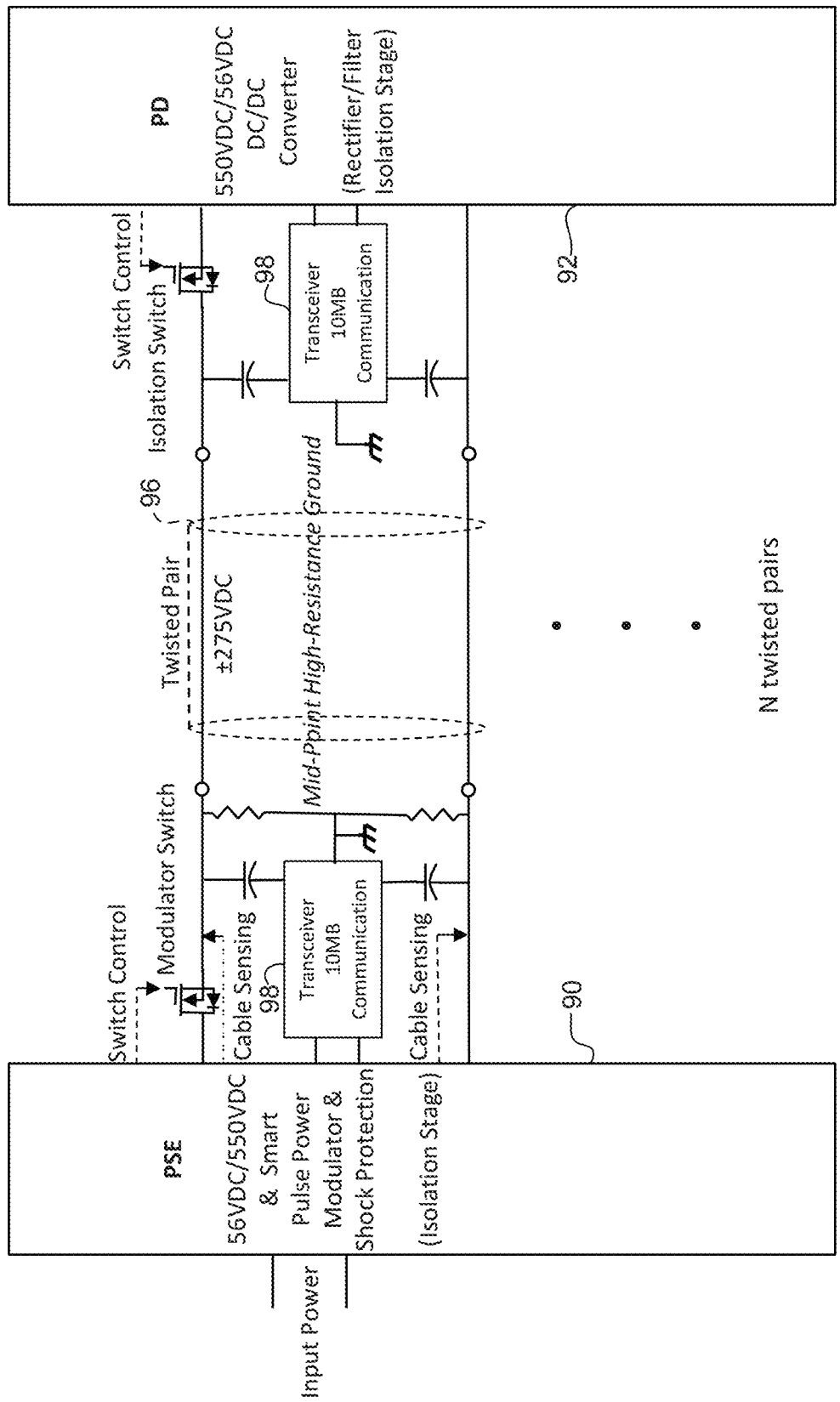
FIG. 10 illustrates details of one of the twisted pairs shown in FIG. 9, in accordance with one embodiment.

FIG. 10 illustrates additional details of one of the twisted pairs 96 shown in FIG. 9, in accordance with one embodiment. In this example, the system provides high resistance mid-point grounding for shock protection. In one example, mid-point grounding drops the line to ground voltage (e.g., 275V line-to-ground, 550V line-to-line). In one or more embodiments, both feed and return of each transmission pair is switched to implement effective control and line-to-ground fault detection is between 10-100 μs. As shown in FIG. 10, cable sensing may be provided at the PSE 90. The system may provide line-to-ground (GFI (Ground Fault Interrupters)) shock protection and line-to-line shock protection for any cable fault condition during auto-negotiation with high-voltage pulse off-time. One or more embodiments provide single point of failure and redundancy for any high-voltage path to cable. In one or more embodiments, the system may use 48-56 VDC low voltage for initial start-up conditions and default condition to establish data link and safety interlock before enabling high voltage operation. In one example, 10 MB communications are provided over the twisted pair 96 during high voltage on pulse as shown at transceiver 98.

Additional safety and fault protection may be included as described, for example, in U.S. patent application Ser. No. 15/971,729, filed May 4, 2018, entitled "High Power and Data Delivery in a Communications Network with Safety and Fault Protection", which is incorporated herein by reference in its entirety.

FIG. 11 illustrates an example of a multi-phase pulse power distribution system, in accordance with one embodiment. A PSE source 110 delivers power and data over a PoF cable assembly 114 comprising fibers and wires to a plurality of PDs 112. In one or more embodiments, the multi-phase pulse power is delivered at a voltage of at least 200 volts on the multi-phase DC pulse power cable 114. In one example, 1-2 kW of power is provided on copper pairs with data fiber pairs over 1-10 km with 550 VDC pulse power. As previously described, the pulse power may comprise any number of phases. As noted above, the system may use 56 VDC low voltage for initial start-up conditions and default condition to establish data link and safety interlock before enabling high voltage operation. 550 VDC pulse power may be distributed to multiple low power PD PON endpoint loads such as 5G radio sets, for example.

It is to be understood that the voltages and power levels shown in FIG. 11 and described herein are only examples and that other voltages or power levels may be used, as previously described. For example, the input may comprise 115 VAC, 10/13A at 1100 W with at least two power inputs. The high voltage output may comprise, for example, 275/550/1100 VDC at 3 kW and may be adjustable (0-100%). The low voltage output may comprise, for example, 56V, 12V, 3.3V at 150 W, or any other suitable low voltage output.

Figure 12:
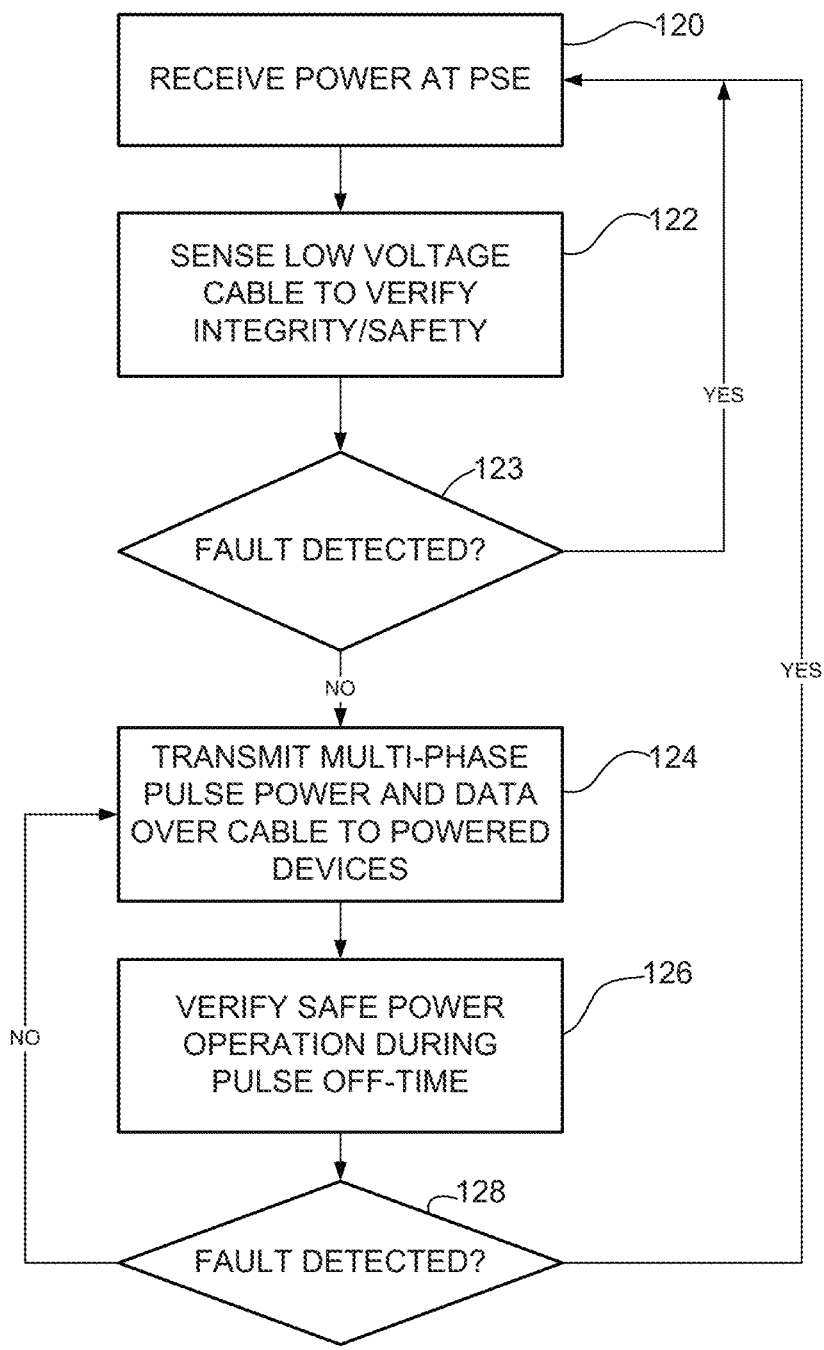
FIG. 12 is a flowchart illustrating an overview of a process for delivering multi-phase pulse power, in accordance with one embodiment.

FIG. 12 is a flowchart illustrating an overview of a process for delivering multi-phase pulse power, in accordance with one embodiment. At step 120, a power sourcing equipment network device (e.g., PSE 10 in FIG. 1) receives input power. At step 122, safe, low voltage cable sensing is performed to verify safety and integrity of the cable prior to connection to high voltage. The low voltage test may be used to characterize the cable and detect line-to-ground and line-to-line faults before connecting the high voltage. If any faults are detected during the low voltage test, high voltage power is not applied (step 123). If cable integrity is verified, the PSE 10 transmits the multi-phase pulse power and data over a combined cable to multiple powered devices (step 124). As previously described, the pulse power is delivered on two or more wires to enable phasing of the conduction so that at least one wire (wire, wire pair) is on at any time, thereby providing continuous power at the PD. The PSE verifies safe power operation during off-time of pulses for each phase (step 126). The off-time may be used to check the cable for shorts, opens, unreported power loss, or added impedance (e.g., due to human or animal contact), for example. Verification of safe power operation during pulse off-time may comprise, for example, monitoring of high voltage decay to detect cable or system faults and a low voltage test before initiating the next on-pulse. If no faults are detected (step 128), the next on-pulse may be initiated (step 124). Line-to-ground faults may be monitored continuously so that protection response is fast. Line-to-line faults may be detected during off-pulse time and protection consists of inhibiting the next on-pulse.

It is to be understood that the process shown in FIG. 12 is only an example and steps may be added, combined, removed, or modified without departing from the scope of the embodiments.

The embodiments described herein operate in the context of a data communications network including multiple network devices. The network may include any number of network devices in communication via any number of nodes (e.g., routers, switches, gateways, controllers, access points, or other network devices), which facilitate passage of data within the network. The network devices may communicate over or be in communication with one or more networks (e.g., local area network (LAN), metropolitan area network (MAN), wide area network (WAN), virtual private network (VPN) (e.g., Ethernet virtual private network (EVPN), layer 2 virtual private network (L2VPN)), virtual local area network (VLAN), wireless network, enterprise network, corporate network, data center, Internet of Things (IoT), Internet, intranet, or any other network).

The network is configured to pass electrical power to network devices such as 5G nodes, switches, routers, access points, or other electronic components and devices. Signals may be exchanged among communications equipment and power transmitted from power sourcing equipment to powered devices. The network may include any number or arrangement of network communications devices (e.g., switches, access points, routers, or other devices operable to route (switch, forward) data communications).

Figure 13:
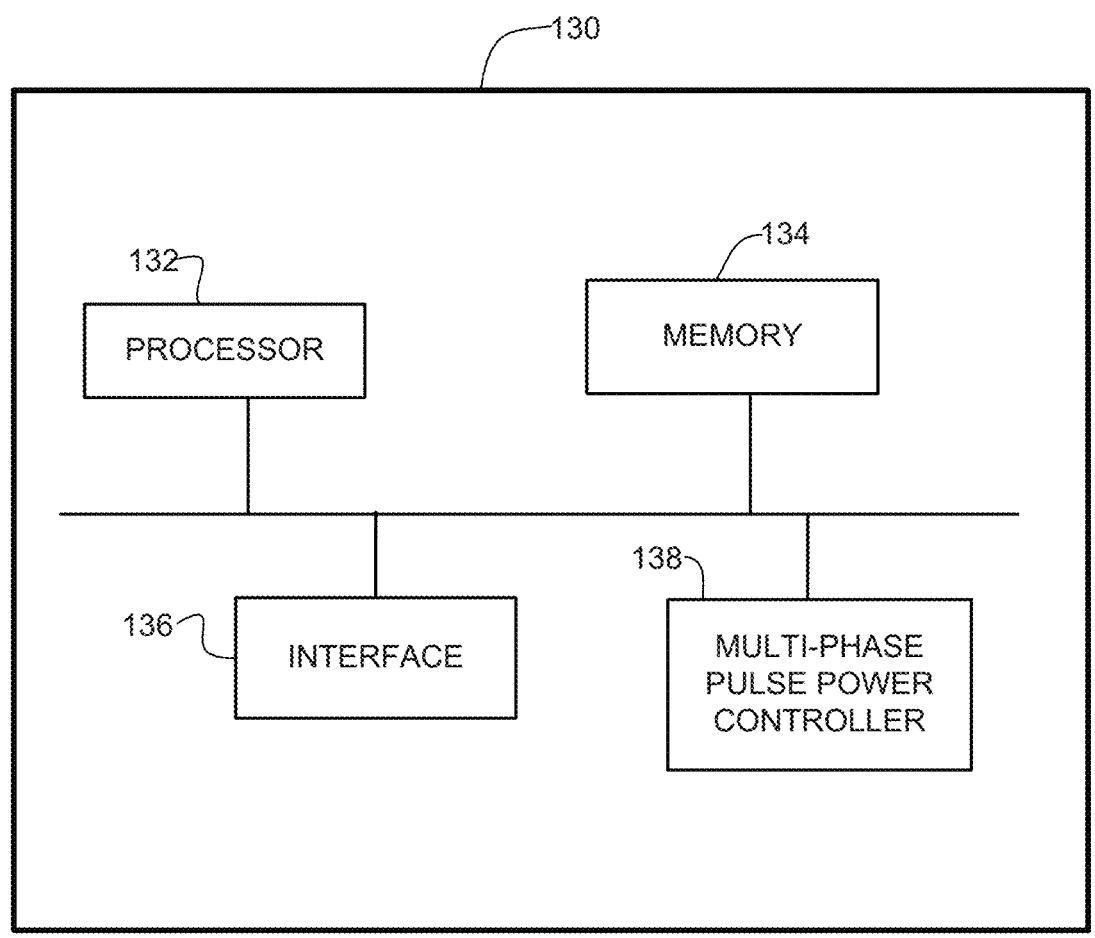
FIG. 13 is a block diagram depicting an example of a network device useful in implementing embodiments described herein.

FIG. 13 is a block diagram illustrating an example of a network device 130 (e.g., PSE, PD) that may be used to implement the embodiments described herein. In one embodiment, the network device 130 is a programmable machine that may be implemented in hardware, software, or any combination thereof. The network device 130 includes one or more processor 132, memory 134, interface 136, and multi-phase pulse power control module 138.

Memory 134 may be a volatile memory or non-volatile storage, which stores various applications, operating systems, modules, and data for execution and use by the processor 132. For example, components of the multi-phase power controller module 138 (e.g., code, logic, or firmware, etc.) may be stored in the memory 134. The network device 130 may include any number of memory components.

The network device 130 may include any number of processors 132 (e.g., single or multi-processor computing device or system), which may communicate with a forwarding engine or packet forwarder operable to process a packet or packet header. The processor 132 may receive instructions from a software application or module, which causes the processor to perform functions of one or more embodiments described herein.

Logic may be encoded in one or more tangible media for execution by the processor 132. For example, the processor 132 may execute codes stored in a computer-readable medium such as memory 134. The computer-readable medium may be, for example, electronic (e.g., RAM (random access memory), ROM (read-only memory), EPROM (erasable programmable read-only memory)), magnetic, optical (e.g., CD, DVD), electromagnetic, semiconductor technology, or any other suitable medium. In one example, the computer-readable medium comprises a non-transitory computer-readable medium. Logic may be used to perform one or more functions described above with respect to the flowchart of FIG. 12.

The interface 136 may comprise any number of power interfaces or network (data) interfaces (line cards, ports, connectors, receptacles, power interface, combined data and power cable interface) for receiving data or power, or transmitting data or power to other devices. The network interface may be configured to transmit or receive data using a variety of different communications protocols and may include mechanical, electrical, and signaling circuitry for communicating data over physical links coupled to the network. For example, line cards may include port processors and port processor controllers. The power interface may be configured for PoF, PoE, higher power PoE, enhanced PoE, PoE+, UPoE, or similar operation.

It is to be understood that the network device 130 shown in FIG. 13 and described above is only an example and that different configurations of network devices may be used. For example, the network device may further include any suitable combination of hardware, software, algorithms, processors, devices, components, or elements operable to facilitate the capabilities described herein.

As can be observed from the foregoing, one or more embodiments provide improved power delivery with enhanced reliability and safety over an extended length of cable to provide high power (e.g., 1000 W, 2000 W, 6000 W, or other power >100 W). In one example, a two phase system greatly reduces or eliminates energy storage filtering used at the PD to produce smooth DC voltage. In one example, a two phase pulse power transmission system operates out of phase at 50% or greater duty cycle to produce smooth DC voltage. In another example, a three (or greater) phase pulse power transmission system operates phase shifted at 67% or greater duty cycle to reduce individual wire currents to extend transmission distance. In one example, a three phase pulse power transmission system operates phase shifted at 67% or greater duty cycle to introduce redundancy to protect against individual wire failure. The number of phases may be further increased (maintaining phase shifting) to further reduce individual wire currents to extend transmission distance and/or add redundancy. A four phase implementation with four pairs of wires may have reduced individual pair currents and may utilize existing cable infrastructure. The pulse power design concept with multi-phase power distribution described herein allows for higher-power transmission with higher efficiency, lower EMC, and filter size/cost reduction using high voltage power transmission safely across multiple short distributed branch nodes and long distances at a low installation and operational cost with improved efficiency.

Although the method and apparatus have been described in accordance with the embodiments shown, one of ordinary skill in the art will readily recognize that there could be variations made without departing from the scope of the embodiments. Accordingly, it is intended that all matter contained in the above description and shown in the accompanying drawings shall be interpreted as illustrative and not in a limiting sense.

What is claimed is:

1. An apparatus comprising:
   an input power interface for receiving input power;
   a power sourcing equipment comprising one or more power supply units coupled to receive input power and provide output power at one or more power levels, a processor, and a pulse power modulator, the pulse power modulator receiving as input the output power from the one or more power supply units and configured to output DC (Direct Current) pulse power on multiple phases for transmission over a cable to a plurality of powered devices, wherein the DC pulse power comprises voltage pulses with high voltage power delivered during a pulse on-time and the voltage pulses being shifted in phase among said multiple phases to provide continuous power, and wherein the power sourcing equipment includes one or more circuits configured to verify operation of the cable during an off-time of pulses in the DC pulse power and to verify operation of the plurality of powered devices for each of the multiple phases before the processor is configured to control the pulse power modulator to transmit the DC pulse power; and
   a cable interface for delivery of the DC pulse power on said multiple phases and data over the cable to said plurality of powered devices.
2. The apparatus of claim 1, wherein the power sourcing equipment comprises one or more safety circuits that perform line sensing with one or more of the plurality of powered devices.
3. The apparatus of claim 1, wherein the cable comprises at least two wires operating out of phase at 50% or greater duty cycle.
4. The apparatus of claim 1, wherein the cable comprises at least three wires for at least three phases of operation and wherein said continuous power is delivered to said plurality of powered devices upon loss of one of said at least three phases.
5. The apparatus of claim 4, wherein each of said at least three wires comprises a wire pair.
6. The apparatus of claim 1, wherein the cable further comprises a communications transmission media for bidirectional communications between the apparatus and said plurality of powered devices.
7. The apparatus of claim 6, wherein the communications transmission media comprises optical fibers.
8. The apparatus of claim 1, wherein the data is transmitted over pulse power wires and provides synchronization with said plurality of powered devices.
9. The apparatus of claim 1, wherein the power sourcing equipment comprises one or more safety circuits that perform cable sensing to identify faults on the cable.
10. The apparatus of claim 1, wherein the pulse power modulator provides continuous current that is shared during overlap of said multiple phases.
11. A method comprising:
    receiving power at a power sourcing equipment;
    phasing conduction of DC (Direct Current) pulse power over a plurality of wires to provide continuous DC voltage to a plurality of powered devices;
    simultaneously transmitting multiple phase pulse power and data signals associated with at least two of multiple phases over a cable to said plurality of powered devices, wherein the multiple phase pulse power comprises voltage pulses with high voltage power delivered during a pulse on-time and voltage pulses being shifted in phase among said multiple phases to provide continuous power; and
    verifying operation of the cable and the plurality of powered devices before transmitting the multiple phase pulse power.
12. The method of claim 11, further comprising performing line sensing with respect to each of the plurality of powered devices.
13. The method of claim 11, wherein the DC pulse power is delivered on at least two wires to enable phasing of the pulses so that at least one wire is on at any time to provide said continuous power at the plurality of powered devices.
14. The method of claim 11, wherein the verifying operation of the cable comprises checking for at least one of a thermal buildup, a current disparity, or a ground fault.
15. The method of claim 14, further comprising interrupting transmission of the DC pulse power on at least one of the multiple phases based on said verifying cable operation.
16. The method of claim 15, further comprising continuously transmitting, during the interruption of the transmission of the DC pulse power on said at least one of the multiple phases, the DC pulse power on remaining phases.
17. The method of claim 16, further comprising adjusting, during the interruption of the transmission of the DC pulse power on said at least one of the multiple phases, the DC pulse power on the remaining phases to maintain full power at the plurality of powered devices.
18. The method of claim 17, wherein the DC pulse power is adjusted by adjusting current transmitted by said remaining phases.
19. The method of claim 17, wherein the DC pulse power is adjusted by adjusting duty cycles of said remaining phases.
20. The method of claim 11, wherein each of the multiple phases of the DC pulse power is associated with one or more data signals.

21. The method of claim 11, further comprising controlling pulse off-time of the voltage pulses based on a detected cable characterization and fixing pulse on-time of the voltage pulses based on a safety factor.

22. A method comprising:
- at a power sourcing equipment, generating pulse power on multiple phases comprising Direct Current (DC) pulses with high power during pulse on-times that are separated by pulse off-times, the pulse off-times being between two successive pulse on-times, and the pulses DC being shifted in phase among the multiple phases to provide continuous power;
- verifying, during one or more of the pulse off-times of the pulses in the pulse power, operation of a cable coupled between the power sourcing equipment and a plurality of powered devices; and
- transmitting the pulse power to the plurality of powered devices after verifying that the cable is operating for each of the multiple phases of pulse power.

23. The method of claim 22, wherein transmitting comprises transmitting the pulse power on at least two wires to enable phasing of the pulses so that at least one wire is on at any time to provide said continuous power at the plurality of powered devices.

24. The method of claim 22, wherein the verifying comprises checking for at least one of a thermal buildup, a current disparity, or a ground fault.

25. The method of claim 22, further comprising interrupting transmission of the pulse power on at least one of the multiple phases based on the verifying.

26. The method of claim 25, further comprising continuously transmitting, during the interruption of the transmission of the pulse power on said at least one of the multiple phases, pulse power on remaining phases of the multiple phases.

27. The method of claim 26, further comprising adjusting, during the interruption of the transmission of the pulse power on said at least one of the multiple phases, pulse power on the remaining phases to maintain full power at the plurality of powered devices.

28. The method of claim 27, wherein the adjusting comprises adjusting current of said remaining phases.

* * * * *

UNITED STATES PATENT AND TRADEMARK OFFICE
CERTIFICATE OF CORRECTION

| | | |
|---|---|---|
| PATENT NO. | : 12,126,456 B2 | Page 1 of 1 |
| APPLICATION NO. | : 17/560424 | |
| DATED | : October 22, 2024 | |
| INVENTOR(S) | : Richard Anthony O'Brien et al. | |

It is certified that error appears in the above-identified patent and that said Letters Patent is hereby corrected as shown below:

In the Claims

Claim 20, Column 14, Lines 66-67, please replace "with one or more data signals" with --with one or more of the data signals--

Claim 22, Column 15, Lines 10-11, please replace "and the pulses DC being" with --and the DC pulses being--

Signed and Sealed this
Twenty-fourth Day of December, 2024

Derrick Brent
*Acting Director of the United States Patent and Trademark Office*